(12) United States Patent
Onitsuka et al.

(10) Patent No.: US 8,020,265 B2
(45) Date of Patent: Sep. 20, 2011

(54) METHOD OF MANUFACTURING A PIEZOELECTRIC VIBRATOR

(75) Inventors: Osamu Onitsuka, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/852,001

(22) Filed: Aug. 6, 2010

(65) Prior Publication Data

US 2010/0320877 A1    Dec. 23, 2010

Related U.S. Application Data

(63) Continuation of application No. PCT/JP2008/069849, filed on Oct. 31, 2008.

(30) Foreign Application Priority Data

Feb. 18, 2008  (JP) .................... 2008-035510
Feb. 18, 2008  (JP) .................... 2008-036718

(51) Int. Cl.
  *H04R 17/10*   (2006.01)
  *H01L 41/053*  (2006.01)
(52) U.S. Cl. .......... 29/25.35; 29/852; 310/342; 310/348
(58) Field of Classification Search ............ 29/25.35, 29/830, 846, 852; 310/340, 342, 348, 370, 310/365, 368
See application file for complete search history.

(56) References Cited

U.S. PATENT DOCUMENTS

| 4,716,082 A | 12/1987 | Ahearn et al. |
| 5,497,546 A | 3/1996 | Kubo et al. |
| 6,686,219 B2 * | 2/2004 | Aratake et al. |

FOREIGN PATENT DOCUMENTS

| JP | 06-151035 A | 5/1994 |
| JP | 08-316644 A | 11/1996 |
| JP | 2001-244358 A | 9/2001 |
| JP | 2002-124845 A | 4/2002 |
| JP | 2003-163562 A | 6/2003 |
| JP | 2003-324166 A | 11/2003 |
| JP | 2005-129600 A | 5/2005 |
| JP | 2006005019 A * | 1/2006 |
| JP | 2007-013636 A | 1/2007 |
| JP | 2007-242872 A | 9/2007 |

OTHER PUBLICATIONS

International Search Report for International Application No. PCT/JP2008/069849, dated Jan. 20, 2009, 2 pages.

* cited by examiner

*Primary Examiner* — A. Dexter Tugbang
(74) *Attorney, Agent, or Firm* — Brinks Hofer Gilson & Lione

(57) ABSTRACT

A method for manufacturing a plurality of piezoelectric vibrators includes forming, in the lid substrate wafer, a plurality of cavity recesses forming a plurality of through-electrodes in and through the base substrate wafer; bonding the plural piezoelectric vibration members to the upper face of the base substrate wafer via routing electrodes; overlaying the base substrate wafer and the lid substrate wafer; bonding the base substrate wafer and the lid substrate wafer; and cutting the two bonded wafers into the plural piezoelectric vibrators. Forming the plurality of through-holes includes disposing electroconductive core members having two flat ends and a thickness substantially equal to that of the base substrate wafer, in the plurality of through-holes, and disposing connection members between the core members and the through-holes; and firing the connection members at a predetermined temperature to integrally fix the through-hole, the connection member and the core member to each other.

13 Claims, 30 Drawing Sheets

METHOD OF MANUFACTURING A PIEZOELECTRIC VIBRATOR

RELATED APPLICATIONS

This application is a continuation of PCT/JP2008/069849 filed on Oct. 31, 2008, which claims priority to Japanese Application Nos. 2008-036718 filed on Feb. 18, 2008 and 2008-035510 filed on Feb. 18, 2008. The entire contents of these applications are incorporated herein by reference.

TECHNICAL FIELD

The present invention relates to a surface mount device-type (SMD) piezoelectric vibrator in which a piezoelectric vibration member is sealed up in a cavity formed between two bonded substrates, to a piezoelectric vibrator manufacturing method for manufacturing the piezoelectric vibrator, and to an oscillator, an electronic device and a radio-controlled watch having the piezoelectric vibrator.

The present application is based on basic applications of Japanese Patent Application No. 2008-36718 and Japanese Patent Application No. 2008-35510, the entire contents thereof being hereby incorporated.

BACKGROUND ART

In recent years, mobile telephones and portable information terminal devices employ a piezoelectric vibrator using quartz crystal or the like as a time source, a timing source of control signals or the like, a reference signal source, etc. As this type of piezoelectric vibrator, various ones are offered. As one of them, a surface mount device-type piezoelectric vibrator is known. As the piezoelectric vibrator of the type, generally known is a three-layer structure type one in which a piezoelectric substrate with a piezoelectric vibration member formed thereon is sandwiched between a base substrate and a lid substrate and bonded all together. In this case, the piezoelectric vibrator is housed in the cavity (sealed unit) formed between the base substrate and the lid substrate. Recently, not only the above-mentioned three-layer structure type one but also a two-layer structure type one has been developed.

The piezoelectric vibrator of the type has a two-layer structure in which the base substrate and the lid substrate are directly bonded to each other; and a piezoelectric vibration member is housed in the cavity formed between the two substrates.

As compared with a three-layer structure one, the two-layer structure type piezoelectric vibrator is excellent in that it can be thinned, and is therefore favorably used. As one of such two-layer structure type piezoelectric vibrators, a piezoelectric vibrator is known, in which the piezoelectric vibration member is electrically connected to the external electrode formed on the base substrate using the electroconductive member formed to run through the base substrate (see Patent Reference 1 and Patent Reference 2).

The piezoelectric vibrator 600 comprises, as shown in FIG. 41 and FIG. 42, a base substrate 601 and a lid substrate 602 anodically-bonded to each other via a bonding film 607, and a piezoelectric vibration member 603 sealed up in the cavity C formed between the two substrates 601 and 602. The piezoelectric vibration member 603 is, for example, a tuning fork-type vibration member, and this is mounted on the upper face of the base substrate 601 via an electroconductive adhesive E in the cavity C.

The base substrate 601 and the lid substrate 602 are, for example, insulating substrates of ceramics, glass or the like.

Of the two substrates 601 and 602, the base substrate 601 has through-holes 604 running through the substrate 601. The through-hole 604 is filled with an electroconductive member 605 to seal up the through-hole 604. The electroconductive member 605 is electrically connected to the outer electrode 606 formed on the lower face of the base substrate 601, and is electrically connected to the piezoelectric vibration member 603 mounted in the cavity C.

Patent Reference 1: JP-A 2002-124845
Patent Reference 2: JP-A 2006-279872

In the above-mentioned, two-layer structure type piezoelectric vibrator, the electroconductive member 605 plays important two roles of blocking the through-hole 604 to thereby airtightly seal up the cavity C, and electrically connecting the piezoelectric vibration member 603 to the external electrode 606. In particular, in case where the adhesion to the through-hole 604 is insufficient, then the airtight sealing inside the cavity C may be lost; and in case where the contact with the electroconductive adhesive E or the external electrode 606 is insufficient, then the piezoelectric vibration member 603 may work erroneously. Accordingly, for evading such failures, the electroconductive member 605 must be formed in such a state that it completely blocks the through-hole 604 while kept in firm contact with the inner face of the through-hole 604 and it has no depression on the surface thereof.

However, Patent Reference 1 and Patent Reference 2 describe formation of the electroconductive member 605 with an electroconductive paste (Ag paste, Au—Sn paste, etc.), but have no description relating to a concrete manufacturing method of how to practically form it.

In general, in case where an electroconductive paste is used, it must be fired and hardened. In other words, after the through-hole 604 is filled with an electroconductive paste, it must be fired and hardened. When fired, however, the organic matter in the electroconductive paste may be lost through evaporation; and therefore, in general, the volume after firing decreases as compared with that before firing (for example, in case where an Ag paste is used as the electroconductive paste, the volume may decrease by about 20% or so). Accordingly, even when the electroconductive member 605 is formed with an electroconductive paste, the surface may have depressions formed thereon or, in some serious cases, there may be a risk of forming through-holes in the center.

As a result, the cavity C may lose its airtightness, or there is a possibility that the electric connection between the piezoelectric vibration member 603 and the external electrode 606 may be lost.

SUMMARY OF THE INVENTION

The present invention has been made in consideration of the situation as above, and its object is to provide a high-quality two-layer structure-type, surface-mount piezoelectric vibrator that surely maintains the airtightness inside the cavity and secures stable electric connection between the piezoelectric vibration member and the external electrode. The invention is also to provide a piezoelectric vibrator manufacturing method of efficiently manufacturing many such piezoelectric vibrators all at a time, and to provide an oscillator, an electronic device and a radio-controlled watch comprising the piezoelectric vibrator.

(1) To solve the above-mentioned problems and to attain the objects, the invention provides a piezoelectric vibrator manufacturing method. The piezoelectric vibrator manufacturing method of the invention is a method for manufacturing a plurality of piezoelectric vibrators in which a piezoelectric vibration member is sealed up in a cavity formed between a base substrate and a lid substrate bonded to each other, all at once by utilizing a base substrate wafer and a lid substrate wafer.

The method comprises a recess forming step of forming, in the lid substrate wafer, a plurality of cavity recesses for forming cavities when the two wafers are overlaid; a through-electrode forming step of forming a plurality of through-electrodes in and through the base substrate wafer; a routing electrode forming step of forming a plurality of routing electrodes connected electrically with the through-electrodes, on the upper face of the base substrate wafer; a mounting step of bonding the plural piezoelectric vibration members to the upper face of the base substrate wafer via the routing electrodes; an overlaying step of overlaying the base substrate wafer and the lid substrate wafer thereby to house the piezoelectric vibration members in the cavities surrounded by the recesses and the two wafers; a bonding step of bonding the base substrate wafer and the lid substrate wafer thereby to seal up the piezoelectric vibration members in the cavities; an external electrode forming step of forming a plurality of external electrodes connected electrically with the through-electrodes, on the lower face of the base substrate wafer; and a cutting step of cutting the two bonded wafers thereby to shred them into the plural piezoelectric vibrators, wherein the through-electrode forming step includes a through-hole forming step of forming a plurality of through-holes in and through the base substrate wafer; a setting step of disposing electroconductive core members which are formed to have two flat ends and a thickness substantially equal to that of the base substrate wafer, in those plural through-holes, and disposing connection members between the core members and the through-holes; and a firing step of firing the connection members at a predetermined temperature to thereby integrally fix the through-hole, the connection member and the core member to each other.

According to the piezoelectric vibrator manufacturing method of the invention, the through-electrode is formed by utilizing the core member and the connection member, and therefore the through-electrodes thus formed can be substantially in a flat configuration relative to the base substrate. Accordingly, a high-quality two-layer structure-type, surface-mount piezoelectric vibrator that secures stable electric connection between the piezoelectric vibration member and the external electrode and therefore has improved reliability of operation performance can be manufactured. In addition, since a base substrate wafer and a lid substrate wafer are used, piezoelectric vibrators can be manufactured efficiently all at once.

(2) As the connection member, a paste may be used; and in the setting step, the paste may be implanted between the core member and the through-hole; and in the firing step, the implanted paste may be fired and hardened to thereby integrally fix the paste, the core member and the through-hole to each other.

In this case, first attained is the recess forming step for forming a plurality of cavity recesses in the lid substrate wafer. The recesses are those to be cavities when the two wafers are overlaid later. At the same time or in a timing of before or after the step, a through-electrode forming step is attained for forming a plurality of through-electrodes in the base substrate wafer. In this stage, plural through-electrodes are formed so as to be housed in the cavities formed in the lid substrate wafer when the two wafers are overlaid later.

The through-electrode forming step is described in detail. First, a through-hole forming step is attained for forming a plurality of through-holes in and through the base substrate wafer. Subsequently, a setting step is attained for disposing electroconductive core members which are formed to have two flat ends and a thickness substantially equal to that of the base substrate wafer, in those plural through-holes, and implanting a paste in the space between the core member and the through-hole. In particular, since a paste is implanted in the space, the core member is kept stable in the through-hole not dropping off from the through-hole owing to the stickiness of the paste. In this stage, the core member is so controlled that its two ends can be substantially in the same face as the surface of the base substrate wafer.

Subsequently, a firing step is attained for firing the implanted paste at a predetermined temperature to harden it. Accordingly, the paste firmly sticks to the inner face of the through-hole and the core member. As a result, a plurality of through-electrodes can be manufactured, in which the core member and the paste are integrally hardened in the through-hole.

The paste contains an organic matter, and when fired, the organic matter may evaporate away to the result that the volume thereof decreases as compared with that before firing. Accordingly, in case where only a paste is implanted into the through-hole, then the surface of the paste may have large depressions after firing.

However, as described above, a core member is disposed in the through-hole, and then a paste is implanted only in the space between the core member and the through-hole. In other words, the paste is utilized as a transient role of stabilizing the core member in the through-hole. Accordingly, as compared with that in the case where only the paste is implanted in the through-hole, the amount of the paste to be used may be reduced. Therefore, even if the organic matter in the paste may evaporate in the firing step, the paste volume reduction is small since the amount of the paste itself is small. Accordingly, the surface depression to appear after paste hardening can be on an ignorable level. Therefore, the surface of the base substrate wafer, and the two ends of the core member and the paste surface can be substantially in a flat condition. In other words, the surface of the base substrate wafer and the surface of the through-electrode can be substantially in a flat face condition.

Next, a routing electrode forming step is attained for forming a plurality of routing electrodes connected electrically with the through-electrodes by patterning an electroconductive material on the upper face of the base substrate wafer. In this stage, the routing electrode is so formed that it can be housed in the recess formed in the lid substrate wafer when the two wafers are overlaid later.

In particular, the through-electrode comprising the core member and the hardened paste is substantially in a flat condition relative to the upper face of the base substrate wafer as so mentioned in the above. Accordingly, the routing electrode as patterned on the upper face of the base substrate wafer is kept in airtight contact with the through-electrode with no space therebetween. This secures the electric connection between the routing electrode and the through-electrode.

Next, a mounting step is attained for bonding a plurality of piezoelectric vibration members to the upper face of the base substrate wafer each via the routing electrode. Accordingly, the bonded piezoelectric vibration members are electrically connected to the through-electrodes via the routing electrodes. After the mounting operation, an overlaying step is attained for overlaying the base substrate wafer and the lid substrate wafer. Accordingly, the bonded plural piezoelectric vibration members are kept housed in the cavities surrounded by the recesses and the two wafers.

Next, a bonding step is attained for bonding the overlaid two wafers to each other. Accordingly, the two wafers adhere firmly to each other and therefore the piezoelectric vibration members can be sealed up in the cavities. In this stage, the through-holes formed in the base substrate wafer are blocked up with the through-electrodes, and therefore the airtightness inside the cavities is not broken through the through-holes. In particular, the paste to constitute the through-electrodes firmly adheres to both the inner face of the through-hole and the core member, therefore surely securing the airtightness inside the cavities.

Next, an external electrode forming step is attained for forming a plurality of external electrodes electrically connected with the respective through-electrodes by patterning an electroconductive material on the lower face of the base substrate wafer. Also in this case, the through-electrodes are kept substantially in a flat condition relative to the lower face of the base substrate wafer like in the formation of the routing electrodes, and therefore, the patterned external electrodes are kept in airtight contact with the through-electrodes with no space therebetween. Accordingly, the electric connection between the external electrode and the through-electrode can be secured. As a result of this step, the piezoelectric vibration members sealed up in the cavities can be activated as utilizing the external electrodes.

Finally, a cutting step is attained for cutting the base substrate wafer and the lid substrate wafer bonded to each other, to thereby shred them into a plurality of piezoelectric vibrators.

As a result, a plurality of two-layer structure-type surface-mount piezoelectric vibrators with piezoelectric vibration members sealed up in cavities formed between a base substrate and a lid substrate bonded to each other can be manufactured all at once.

In particular, since the through-electrodes can be formed substantially in a flat condition relative to the base substrate, the through-electrodes can be surely kept in airtight contact with the routing electrodes and the external electrodes. As a result, stable electric connection between the piezoelectric vibration members and the external electrodes can be secured, and the reliability of operation performance can be enhanced to attain high-quality devices. Moreover, since the through-electrodes are constituted with electroconductive core members, they secure extremely stable electroconductivity.

In addition, since the airtightness inside the cavities is surely kept, the high quality of the devices is secured in this respect. Further, since the through-electrodes can be formed according to a simple method of using a paste, the process can be simplified.

(3) As the core member, one of which the thermal expansion coefficient is substantially equal to that of the base substrate wafer may be used.

In this case, since the thermal expansion coefficient of the core member is substantially equal to that of the base substrate wafer, the two may thermally expand in the same manner in firing. Accordingly, the core member disposed inside the through-hole does not give any excessive pressure to the base substrate wafer to crack it, owing to the difference in the thermal expansion coefficient, or the space between the core member and the through-hole is not formed more. Therefore, the piezoelectric vibrators can have high quality.

(4) In the setting step, a paste containing a plurality of metal fine particles may be implanted.

In this case, since plural metal fine particles are in the paste, these plural metal fine particles can secure electric conductivity owing to the contact of the plural metal fine particles with each other, in addition to the core member. Accordingly, the electric connection performance of the through-holes can be further enhanced. Therefore, the devices can have further enhanced high quality.

(5) As the metal fine particles, non-spherically formed ones may be used.

In this case, since the metal fine particles in the paste are formed not spherically but non-spherically, for example, like thin and long fibers or like ones having a star-shaped cross section; and therefore, when they are brought into contact with each other, then they could be not in dot-contact but in line-contact with each other. Accordingly, the electric conductivity of the through-electrodes can be further enhanced.

(6) In the setting step, the paste may be implanted in the through-holes after processed for defoaming.

In this case, since the paste is previously processed for defoaming, the paste containing few foams can be implanted. Therefore, the paste volume reduction can be more effectively prevented.

(7) As the connection member, a cylindrical body of a glass material which is formed to have two flat ends and a thickness substantially equal to that of the base substrate wafer, may be utilized; in the setting step, the cylindrical body may be implanted in the through-hole and the core member may be inserted into the center hole of the cylindrical body; and in the firing step, the implanted cylindrical body may be fired to thereby integrally fix the cylindrical body, the through-hole and the core member to each other.

In this case, first attained is the recess forming step for forming a plurality of cavity recesses in the lid substrate wafer. The recesses are those to be cavities when the two wafers are overlaid later. At the same time or in a timing of before or after the step, a through-electrode forming step is attained for forming a plurality of through-electrodes in the base substrate wafer. In this stage, plural through-electrodes are formed so as to be housed in the cavities formed in the lid substrate wafer when the two wafers are overlaid later.

The through-electrode forming step is described in detail. First, a through-hole forming step is attained for forming a plurality of through-holes in and through the base substrate wafer. Subsequently, a setting step is attained for implanting a cylindrical body of a glass material which is formed to have two flat ends and a thickness substantially equal to that of the base substrate wafer in these plural through-holes and inserting an electroconductive core member which is formed to have two flat ends and a thickness substantially equal to that of the base substrate wafer into the center hole of the cylindrical body. In this stage, the cylindrical body and the core member are so planned that both the two ends thereof and the surface of the base substrate wafer can be substantially in a flat condition.

Subsequently, a firing step is attained for firing the implanted cylindrical body at a predetermined temperature. Accordingly, the through-hole, the cylindrical body implanted in the through-hole and the core member implanted in the cylindrical body firmly stick to each other. As a result, a plurality of through-electrodes can be manufactured, in which the cylindrical body and the core member are integrally fixed to each other.

In particular, in forming the through-electrodes, no paste is used but a cylindrical body of a glass material and an electroconductive core member are used to form the through-electrodes, different from conventional ones. In case where a paste is used, the organic matter in the paste may evaporate in firing with the result that the paste volume may remarkably decrease as compared with that before firing. Accordingly, in case where only a paste is implanted in the through-hole, then the paste surface may have large depressions after firing.

However, since the cylindrical body and the core member are used but a paste is not used as so mentioned in the above, there is no risk of forming any large depressions in the surface after firing. By firing, the volume of the cylindrical body may reduce in some degree; however, differing from the case with a paste, the reduction is not so much remarkable and the resulting depressions can be on an ignorable level.

Accordingly, the surface of the base substrate wafer and the two ends of the cylindrical body and the core member can be substantially in a flat condition. In other words, the surface of the base substrate wafer and the surface of the through-electrode can be substantially in a flat condition.

Next, a routing electrode forming step is attained for forming a plurality of routing electrodes connected electrically with the through-electrodes by patterning an electroconductive material on the upper face of the base substrate wafer. In this stage, the routing electrode is so formed that it can be housed in the recess formed in the lid substrate wafer when the two wafers are overlaid later.

In particular, the through-electrode comprising the cylindrical body and the core member is substantially in a flat condition relative to the upper face of the base substrate wafer as so mentioned in the above. Accordingly, the routing electrode as patterned on the upper face of the base substrate wafer is kept in airtight contact with the through-electrode with no space therebetween. This secures the electric connection between the routing electrode and the through-electrode.

Next, a mounting step is attained for bonding a plurality of piezoelectric vibration members to the upper face of the base substrate wafer each via the routing electrode. Accordingly, the bonded piezoelectric vibration members are electrically connected to the through-electrodes via the routing electrodes. After the mounting operation, an overlaying step is attained for overlaying the base substrate wafer and the lid substrate wafer. Accordingly, the bonded plural piezoelectric vibration members are kept housed in the cavities surrounded by the recesses and the two wafers.

Next, a bonding step is attained for bonding the overlaid two wafers to each other. Accordingly, the two wafers adhere firmly to each other and therefore the piezoelectric vibration members can be sealed up in the cavities. In this stage, the through-holes formed in the base substrate wafer are blocked up with the through-electrodes, and therefore the airtightness inside the cavities is not broken through the through-holes. In particular, the cylindrical body and the core member are integrally fixed to each other by firing and these are firmly fixed to the through-holes, therefore surely securing the airtightness inside the cavities.

Next, an external electrode forming step is attained for forming a plurality of external electrodes electrically connected with the respective through-electrodes by patterning an electroconductive material on the lower face of the base substrate wafer. Also in this case, the through-electrodes are kept substantially in a flat condition relative to the lower face of the base substrate wafer like in the formation of the routing electrodes, and therefore, the patterned external electrodes are kept in airtight contact with the through-electrodes with no space therebetween. Accordingly, the electric connection between the external electrode and the through-electrode can be secured. As a result of this step, the piezoelectric vibration members sealed up in the cavities can be activated as utilizing the external electrodes.

Finally, a cutting step is attained for cutting the base substrate wafer and the lid substrate wafer bonded to each other, to thereby shred them into a plurality of piezoelectric vibrators.

As a result, a plurality of two-layer structure-type surface-mount piezoelectric vibrators with piezoelectric vibration members sealed up in cavities formed between a base substrate and a lid substrate bonded to each other can be manufactured all at once.

In particular, since the through-electrodes can be formed substantially in a flat condition relative to the base substrate, the through-electrodes can be surely kept in airtight contact with the routing electrodes and the external electrodes. As a result, stable electric connection between the piezoelectric vibration members and the external electrodes can be secured, and the reliability of operation performance can be enhanced to attain high-quality devices. Moreover, since the through-electrodes are constituted with electroconductive core members, they secure extremely stable electroconductivity.

In addition, since the airtightness inside the cavities is surely kept, the high quality of the devices is secured in this respect.

(8) As the cylindrical body, one previously temporary-fired before firing may be used.

In this case, since the cylindrical body is previously temporary-fired, it hardly deforms or its volume hardly reduces in the subsequent firing. Accordingly, through-electrodes of higher quality can be formed, and the airtightness inside the cavities can be secured more. As a result, piezoelectric vibrators having further higher quality can be manufactured.

(9) As the base substrate wafer, one formed of the same glass material as that of the cylindrical body may be used; and as the core member, one of which the thermal expansion coefficient is substantially equal to that of the cylindrical body may be used.

In this case, as the base substrate wafer, one formed of the same glass material as that of the cylindrical body is used, and as the core member, one of which the thermal expansion coefficient is substantially equal to that of the cylindrical body is used; and therefore, the three can thermally expand to the same degree in firing. Accordingly, any excessive pressure is not given to the base substrate wafer and the cylindrical body to crack them, owing to the difference in the thermal expansion coefficient, or the space between the cylindrical body and the through-hole or between the cylindrical body and the core member is not formed. Therefore, through-electrodes having higher quality can be formed; and as a result, piezoelectric vibrators having further higher quality can be manufactured.

(10) Prior to the mounting step, the method may comprise a bonding film forming step of forming, on the upper face of the base substrate wafer, a bonding film to surround the periphery of the recesses when the base substrate wafer and the lid substrate wafer are overlaid; and in the bonding step, the two wafers may be anodically bonded via the bonding film.

In this case, since the base substrate wafer and the lid substrate wafer are anodically bonded via a bonding film, the two wafers can be more tightly bonded to each other to increase the airtightness inside the cavities. Accordingly, the piezoelectric vibration members can be vibrated with a higher degree of accuracy, and the devices can have further higher quality.

(11) In the mounting step, the piezoelectric vibration members may be bump-bonded with an electroconductive bump.

In this case, since the piezoelectric vibration members are bump-bonded, the piezoelectric vibration members can be spaced above from the upper face of the base substrate by the thickness of the bump. Accordingly, the required minimum vibration gap necessary for vibration of the piezoelectric vibration members can be naturally secured. Therefore, the reliability of the operation performance of the piezoelectric vibrators can be further enhanced.

(12) In the through-hole forming step, the through-holes may be formed to have a tapered cross section.

In this case, since the through-holes are formed to have a tapered cross section, an ordinary method such as a sandblasting method or the like may be employed, and the step can be attained with ease. Accordingly, the manufacturing efficiency can be further more enhanced. In addition, in case where a connection member is set, it is hardly drop off from the through-hole.

(13) In the through-electrode forming step, a core member having a tapered cross section may be used as the core member.

In this case, since a core member having a tapered cross section with a tapered profile is used, it can be readily fitted in the through-hole. Accordingly, the manufacturing efficiency can be further more enhanced.

(14) The piezoelectric vibrator of the invention comprises a base substrate; a lid substrate in which cavity recesses are formed and which is bonded to the base substrate in such a state that the recesses face the base substrate; a piezoelectric vibration member bonded to the upper face of the base substrate in such a state that it is housed in the cavity formed of the recess between the base substrate and the lid substrate; an external electrode formed on the lower face of the base substrate; a through-electrode formed in and through the base substrate and electrically connected with the external electrode with keeping the airtightness inside the cavity; and a routing electrode formed on the upper face of the base substrate to electrically connect the through-electrode to the bonded piezoelectric vibration member; wherein the through-electrode is formed of an electroconductive core member, which is formed to have two flat ends and a thickness substantially equal to that of the base substrate, and is disposed in the through-hole running through the base substrate, and a connection member to integrally fix the core member and the through-hole to each other.

According to the piezoelectric vibrator of the invention, the through-electrode is formed of a core member and a connection member, and therefore the through-hole can be substantially in a flat condition relative to the base substrate. Accordingly, a high-quality two-layer structure-type, surface-mount piezoelectric vibrator that secures stable electric connection between the piezoelectric vibration member and the external electrode and therefore has improved reliability of operation performance can be manufactured. In addition, the airtightness inside the cavity can be surely kept.

(15) The connection member may be a paste hardened by firing.

In this case, the same advantage and effect can be attained as those in the piezoelectric vibrator manufacturing method of the above (2).

(16) The thermal expansion coefficient of the core member may be substantially equal to that of the base substrate.

In this case, the same advantage and effect can be attained as those in the piezoelectric vibrator manufacturing method of the above (3).

(17) The paste may contain a plurality of metal fine particles.

In this case, the same advantage and effect can be attained as those in the piezoelectric vibrator manufacturing method of the above (4).

(18) The metal fine particles may be non-spherical ones.

In this case, the same advantage and effect can be attained as those in the piezoelectric vibrator manufacturing method of the above (5).

(19) The connection member may be a cylindrical body of a glass material which is formed to have two flat ends and a thickness substantially equal to that of the base substrate, and which is fired as implanted in the through-hole; and the core member may be fixed as inserted into the center hole of the cylindrical body.

In this case, the same advantage and effect can be attained as those in the piezoelectric vibrator manufacturing method of the above (7).

(20) The cylindrical body may be previously temporary-fired before firing.

In this case, the same advantage and effect can be attained as those in the piezoelectric vibrator manufacturing method of the above (8).

(21) The base substrate may be formed of the same glass material as that of the cylindrical body; and the thermal expansion coefficient of the core material may be substantially equal to that of the cylindrical body.

In this case, the same advantage and effect can be attained as those in the piezoelectric vibrator manufacturing method of the above (9).

(22) The base substrate and the lid substrate may be anodically bonded via a bonding film formed between the two substrates to surround the periphery of the recesses.

In this case, the same advantage and effect can be attained as those in the piezoelectric vibrator manufacturing method of the above (10).

(23) The piezoelectric vibration members may be bump-bonded with an electroconductive bump.

In this case, the same advantage and effect can be attained as those in the piezoelectric vibrator manufacturing method of the above (11).

(24) The through-holes may be formed to have a tapered cross section.

In this case, the same advantage and effect can be attained as those in the piezoelectric vibrator manufacturing method of the above (12).

(25) The core member may be formed to have a tapered cross section.

In this case, the same advantage and effect can be attained as those in the piezoelectric vibrator manufacturing method of the above (13).

(26) The oscillator of the invention comprises, as the oscillation member therein, the piezoelectric vibrator of any one of the above (12) to (21) as electrically connected to the integrated circuit therein.

(27) The electronic device of the invention comprises the piezoelectric vibrator of any one of the above (12) to (21) as electrically connected to the timer part therein.

(28) The radio-controlled watch of the invention comprises the piezoelectric vibrator of any one of the above (12) to (21) as electrically connected to the filter part therein.

The oscillator, the electronic device and the radio-controlled watch of the invention comprise a high-quality piezoelectric vibrator in which the cavity is surely airtightly sealed up and of which the reliability of the operation performance is enhanced; and therefore the reliability of the operation performance thereof can be enhanced and the quality thereof can be thereby increased.

The piezoelectric vibrator of the invention is a high-quality two-layer structure-type, surface-mount piezoelectric vibrator in which the airtightness inside the cavity is secured and the stable electric connection between the piezoelectric vibration member and the external electrode is secured.

According to the piezoelectric vibrator manufacturing method of the invention, the above-mentioned piezoelectric vibrators can be efficiently manufactured all at once, and the cost thereof can be thereby reduced.

The oscillator, the electronic device and the radio-controlled watch of the invention comprise the above-mentioned piezoelectric vibrator, and similarly the operation reliability thereof can be enhanced and the quality thereof can be thereby increased.

DETAILED DESCRIPTION OF THE PREFERRED EMBODIMENTS

First Embodiment

The first embodiment of the invention is described below with reference to FIG. 1 to FIG. 16.

The piezoelectric vibrator 1 of this embodiment is, as shown in FIG. 1 to FIG. 4, a surface-mount piezoelectric vibrator that is formed to have a two-layer laminate boxy shape composed of a base substrate 2 and a lid substrate 3, in which a piezoelectric vibration member 4 is housed in the cavity C inside it.

Figure 4:
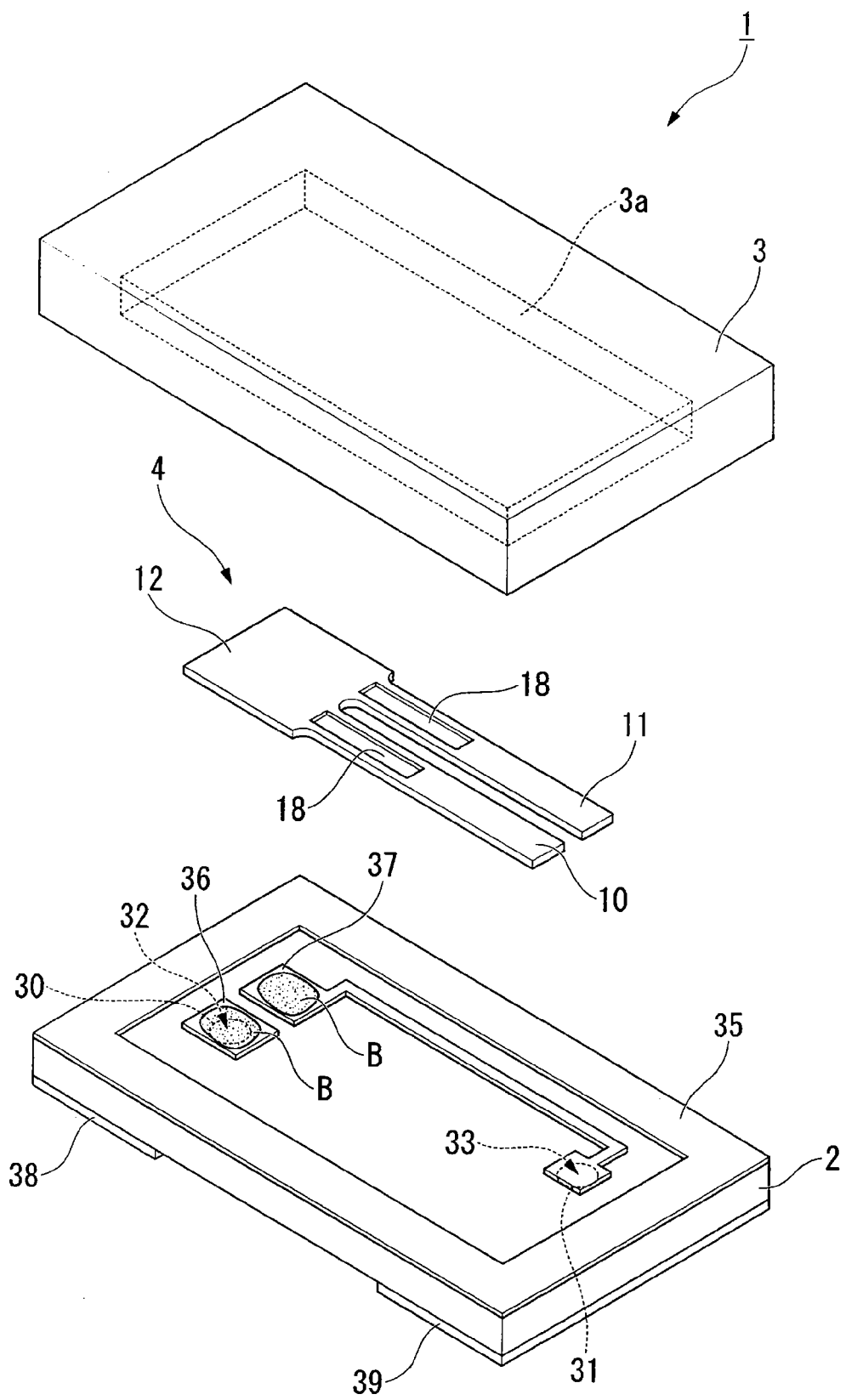
FIG. 4 is a perspective exploded view of the piezoelectric vibrator shown in FIG. 1.

In FIG. 4, an excitation electrode 15, routing electrodes 19 and 20, mount electrodes 16 and 17, and a weight metal film 21 to be mentioned below are omitted for facilitating the understating of the view.

Figure 5:
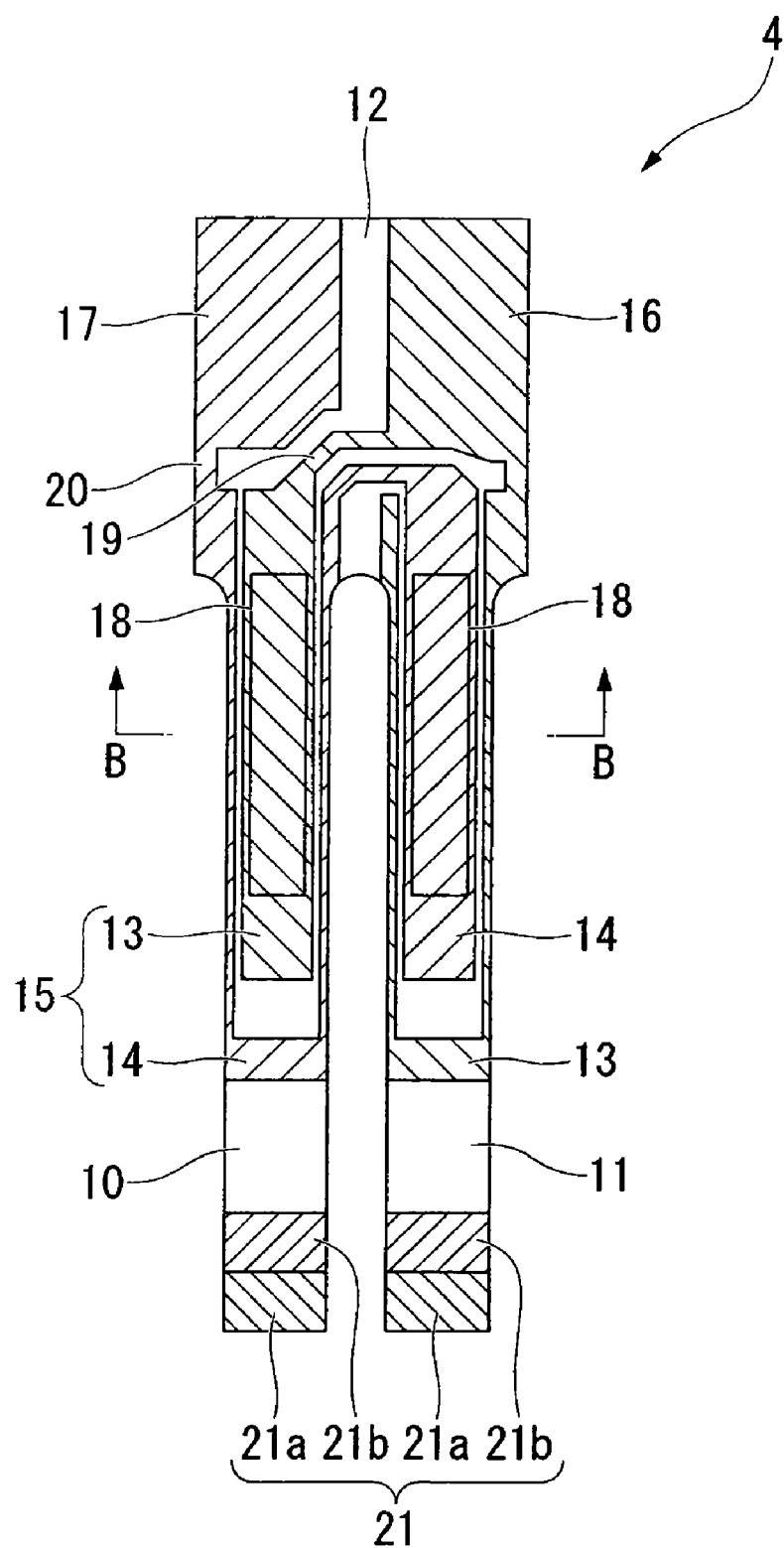
FIG. 5 is a top view of the piezoelectric vibration member constituting the piezoelectric vibrator shown in FIG. 1.
Figure 6:
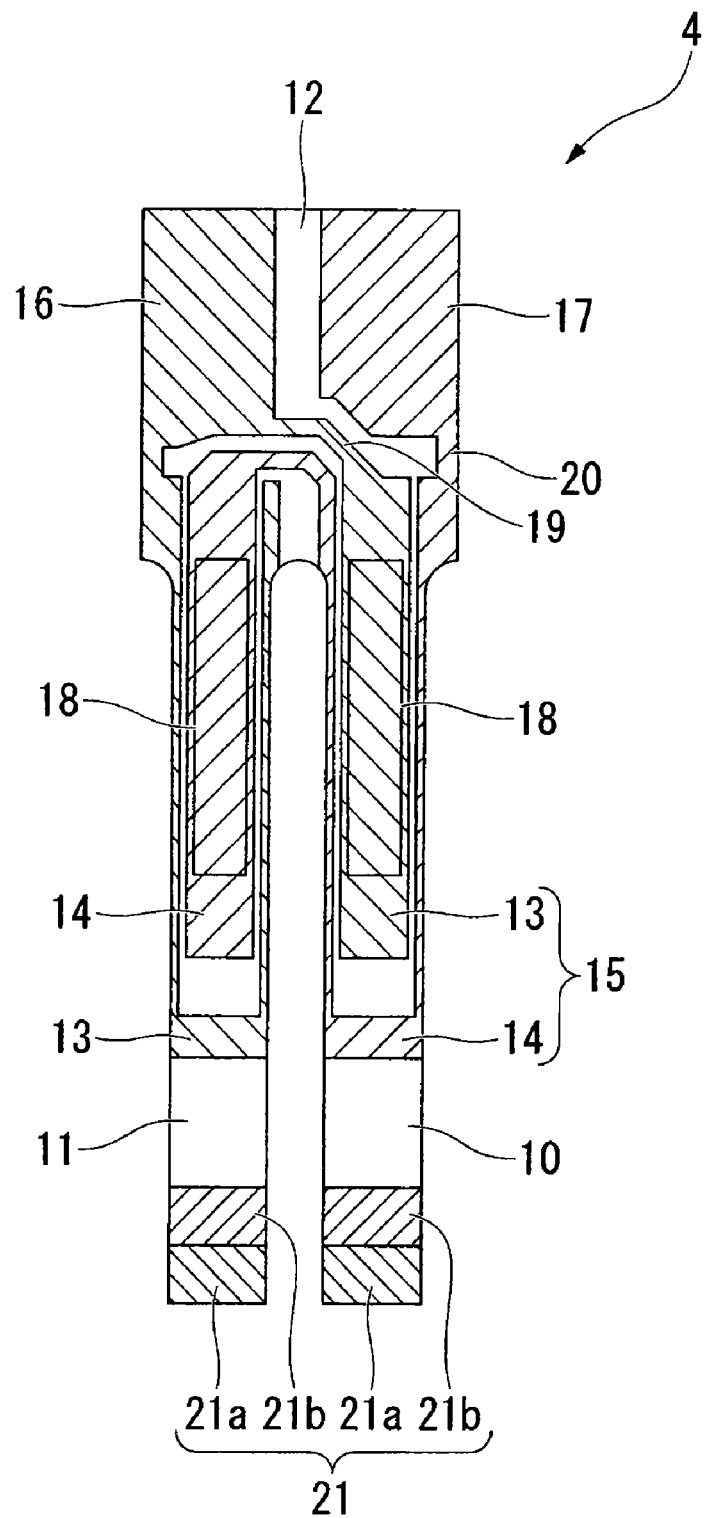
FIG. 6 is a bottom view of the piezoelectric vibration member shown in FIG. 5.
Figure 7:
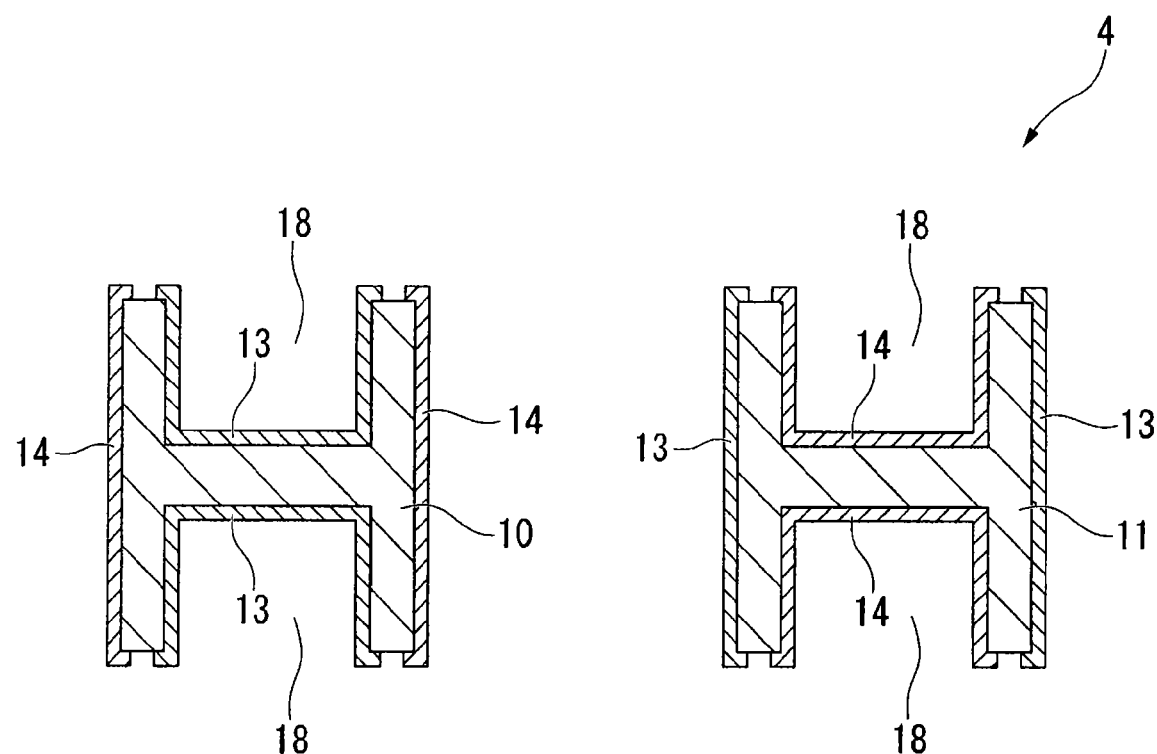
FIG. 7 is a cross-sectional outline view of B-B shown in FIG. 5.

As shown in FIG. 5 to FIG. 7, the piezoelectric vibration member 4 is a tuning fork-like vibration member formed of a piezoelectric material such as crystal, lithium tantalate, lithium niobate or the like, and this vibrates when a predetermined voltage is applied thereto.

The piezoelectric vibration member 4 has a pair of vibration arms 10 and 11 disposed in parallel to each other, a base 12 to integrally fix the base side of the pair of vibration arms 10 and 11, an excitation electrode 15 composed of a first excitation electrode 13 and a second excitation electrode 14 for vibrating the pair of the vibration arms 10 and 11, as formed on the outer surface of the pair of the vibration arms 10 and 11, and mount electrodes 16 and 17 electrically connected with the first excitation electrode 13 and the second excitation electrode 14.

The piezoelectric vibration member 4 in this embodiment comprises, on both the two main faces of the pair of vibration arms 10 and 11, a groove 18 formed along the longitudinal direction of the vibration arms 10 and 11. The groove 18 is formed from the base side to around the intermediate part of the vibration arms 10 and 11.

The excitation electrode 15 composed of the first excitation electrode 13 and the second excitation electrode 14 is an electrode to vibrate the pair of vibration arms 10 and 11 in the direction in which they come near to and get away from each other, at a predetermined resonance frequency, and this is patterned on the outer surface of the pair of vibration arms 10 and 11, as electrically insulated from each other. Concretely, as shown in FIG. 7, the first excitation electrode 13 is formed mainly on the groove 18 of one vibration arm 10 and on the two side faces of the other vibration arm 11; while the second excitation electrode 14 is formed mainly on the two side faces of one vibration arm 10 and on the groove 18 of the other vibration arm 11.

The first excitation electrode 13 and the second excitation electrode 14 are, as shown in FIG. 5 and FIG. 6, electrically connected to the mount electrodes 16 and 17 via the routing electrodes 19 and 20, respectively, on the two main faces of the base 12. The piezoelectric vibration member 4 is given a voltage via the mount electrodes 16 and 17.

The above-mentioned excitation electrode 15, mount electrodes 16 and 17 and routing electrodes 19 and 20 are, for example, formed of a coating film of an electroconductive film of chromium (Cr), nickel (Ni), aluminium (Al), titanium (Ti) or the like.

The top of the pair of vibration arms 10 and 11 is coated with a weight metal film 21 for tuning the vibration condition of the arms themselves within a predetermined frequency range (frequency tuning). The weight metal film 21 is divided into two, a rough-tuning film 21a for use in roughly tuning the frequency and a fine-tuning film 21b for use in finely tuning it. With these rough-tuning film 21a and fine-tuning film 21b, the frequency is tuned, whereby the frequency of the pair of vibration arms 10 and 11 can be controlled to fall within a range of the nominal frequency of the device.

Figure 3:
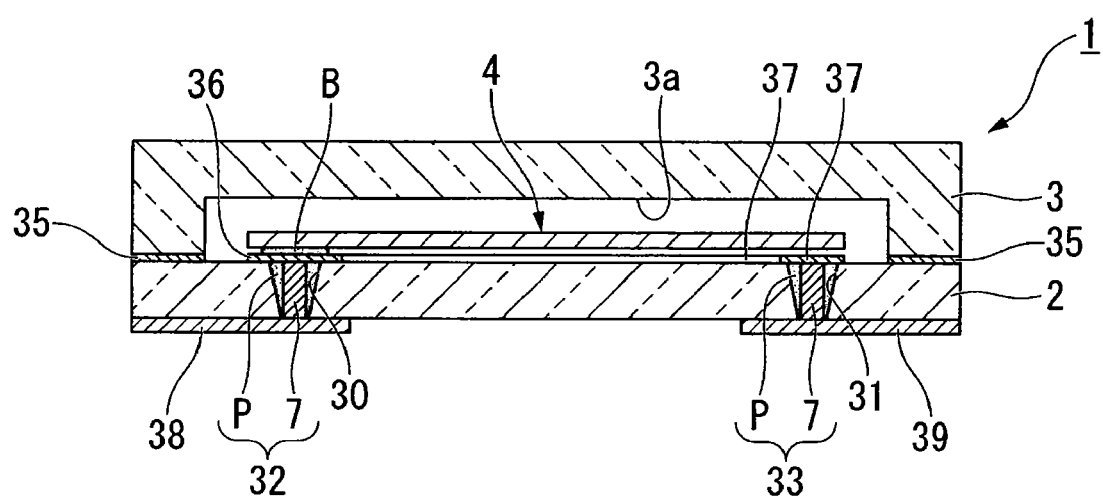
FIG. 3 is a cross-sectional view of the piezoelectric vibrator cut along the line A-A in FIG. 2.

The thus-constituted piezoelectric vibration member 4 is, as shown in FIG. 3 and FIG. 4, bump-bonded to the upper face of the base substrate 2 with a bump B of gold or the like. More concretely, on the two bumps B formed on the routing electrodes 36 and 37 to be mentioned below, as patterned on the upper face of the base substrate 2, a pair of mount electrodes 16 and 17 are bump-bonded as kept in contact with each other. Accordingly, the piezoelectric vibration member 4 is supported as spaced above from the upper face of the base substrate 2, and the mount electrodes 16 and 17 are electrically connected to the routing electrodes 36 and 37, respectively.

Figure 1:
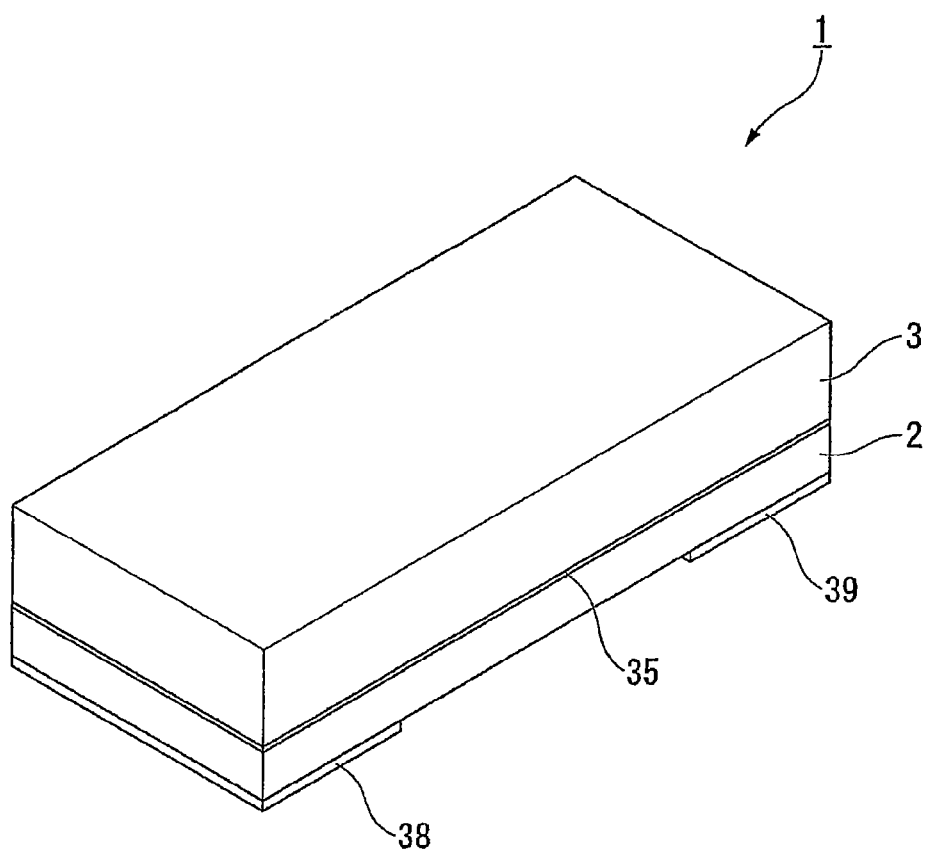
FIG. 1 is a perspective outline view showing the first embodiment of the piezoelectric vibrator of the invention.
Figure 2:
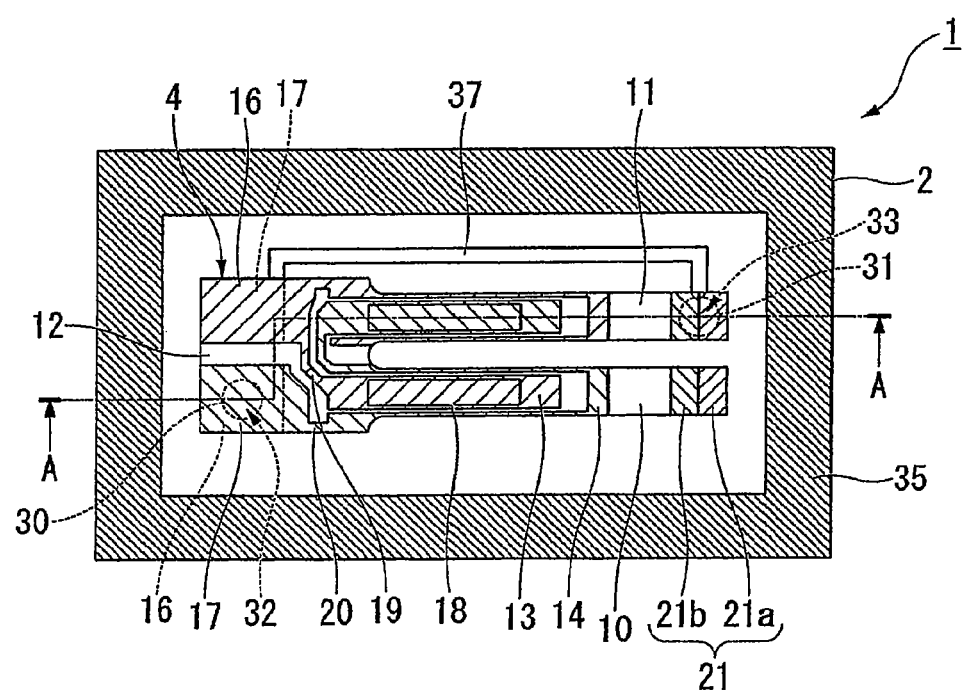
FIG. 2 is an internal configuration view of the piezoelectric vibrator shown in FIG. 1, and is a top view of the piezoelectric vibration member thereof from which the lid substrate was removed.

The lid substrate 3 is a transparent insulating substrate formed of a glass material, for example, soda lime glass; and as shown in FIG. 1, FIG. 3 and FIG. 4, this is shaped to be tabular. On the bonding face side to which the base substrate 2 is bonded, formed is a rectangular recess 3a in which the piezoelectric vibration member 4 is housed. The recess 3a is a cavity recess to be a cavity C to house the piezoelectric vibration member 4 therein when the two substrates 2 and 3 are overlaid. The lid substrate 3 is anodically bonded to the base substrate 2 with the recess 3a kept facing the side of the base substrate 2.

The base substrate 2 is, like the lid substrate 3, a transparent insulating substrate formed of a glass substrate, for example, soda lime glass; and as shown in FIG. 1 to FIG. 4, this is formed to be tabular and have a size capable of being overlaid on the lid substrate 3.

The base substrate 2 is formed to have a pair of through-holes 30 and 31 in and through the base substrate 2. In this case, the pair of through-holes 30 and 31 are so formed as to be housed inside the cavity C. More precisely, the through-holes 30 and 31 in this embodiment are so formed that one through-hole 30 is positioned on the side of the base 12 of the mounted piezoelectric vibration member 4 and the other through-hole 31 is positioned on the top side of the vibration arms 10 and 11.

In this embodiment, a tapered through-hole of which the diameter of the cross section gradually decreases toward the lower face of the base substrate 2 is described as one example; but not limited to this case, the through-hole may also be a straight through-hole that runs straightly through the base substrate 2. Anyhow, the through-hole may be any one that runs through the base substrate 2.

In the pair of through-holes 30 and 31, provided are a pair of through-electrodes 32 and 33 that are so formed to fill up the through-holes 30 and 31. These through-electrodes 32 and 33 are, as shown in FIG. 3, formed of a core member 7 and a paste P (connection member) hardened between the core member 7 and the through-hole 30 or 31. These through-electrodes 32 and 33 play a role of completely blocking up the through-holes 30 and 31 and keeping the airtightness inside the cavity C, and electrically connecting the external electrodes 38 and 39 with the routing electrodes 36 and 37 as described below.

The core member 7 is a columnar electroconductive core member formed of a metal material. The core member 7 has two flat ends and its length is so controlled that it can have a thickness substantially equal to that of the base substrate 2. The core member 7 is positioned substantially in the center of the through-holes 30 and 31, and is firmly adhered to the through-holes 30 and 31 with a paste P.

Via the electroconductive core member 7, the electric conductivity of the through-electrodes 32 and 33 is secured.

On the upper face side of the base substrate 2 (the bonding face side thereof to which a lid substrate 3 is bonded), an anodic-bonding film 35 and a pair of routing electrodes 36 and 37 are patterned with an electroconductive material (for example, aluminium), as shown in FIG. 1 to FIG. 4. Of those, the bonding film 35 is formed along the peripheral edge of the base substrate 2 so as to surround the periphery of the recess 3*a* formed in the lid substrate 3.

The pair of routing electrodes 36 and 37 are so patterned as to electrically connect one through-hole 32 of the pair of through-holes 32 and 33, with one mount electrode 16 of the piezoelectric vibration member 4, and to electrically connect the other through-electrode 33 with the other mount electrode 17 of the piezoelectric vibration member 4.

More precisely, one routing electrode 36 is formed just above one through-electrode 32 so as to be positioned just below the base 12 of the piezoelectric vibration member 4; and the other routing electrode 37 is so formed as to be positioned just above the other through-electrode 33 after drawn from the position adjacent to one routing electrode 36 to the top of the vibration arms 10 and 11 along the vibration arms 10 and 11.

A bump B is formed on the pair of routing electrodes 36 and 37, and via the bump B, the piezoelectric vibration member 4 is mounted. Accordingly, one mount electrode 16 of the piezoelectric vibration member 4 is electrically connected to one through-electrode 32 via one routing electrode 36, and the other mount electrode 17 is electrically connected to the other through-electrode 33 via the other routing electrode 37.

On the lower face of the base substrate 2, formed are external electrodes 38 and 39 to be electrically connected to the pair of through-electrodes 32 and 33, respectively, as shown in FIG. 1, FIG. 3 and FIG. 4. In other words, one external electrode 38 is electrically connected to the first excitation 13 of the piezoelectric vibration member 4 via one through-electrode 32 and one routing electrode 36. The other external electrode 39 is electrically connected to the second excitation electrode 14 of the piezoelectric vibration member 4 via the other through-electrode 33 and the other routing electrode 37.

To operate the thus-constituted piezoelectric vibrator 1, a predetermined driving voltage is applied to the external electrodes 38 and 39 formed on the base substrate 2. Accordingly, a current is applied to the excitation electrode 15 composed of the first excitation electrode 13 and the second excitation electrode 14 of the piezoelectric vibration member 4, whereby the pair of vibration arms 10 and 11 are vibrated at a predetermined frequency in the direction in which they come near to and get away from each other. Based on the vibration of the pair of vibration arms 10 and 11, the vibrator can be used as a time source, a timing source of control signals or the like, a reference signal source, etc.

Figure 8:
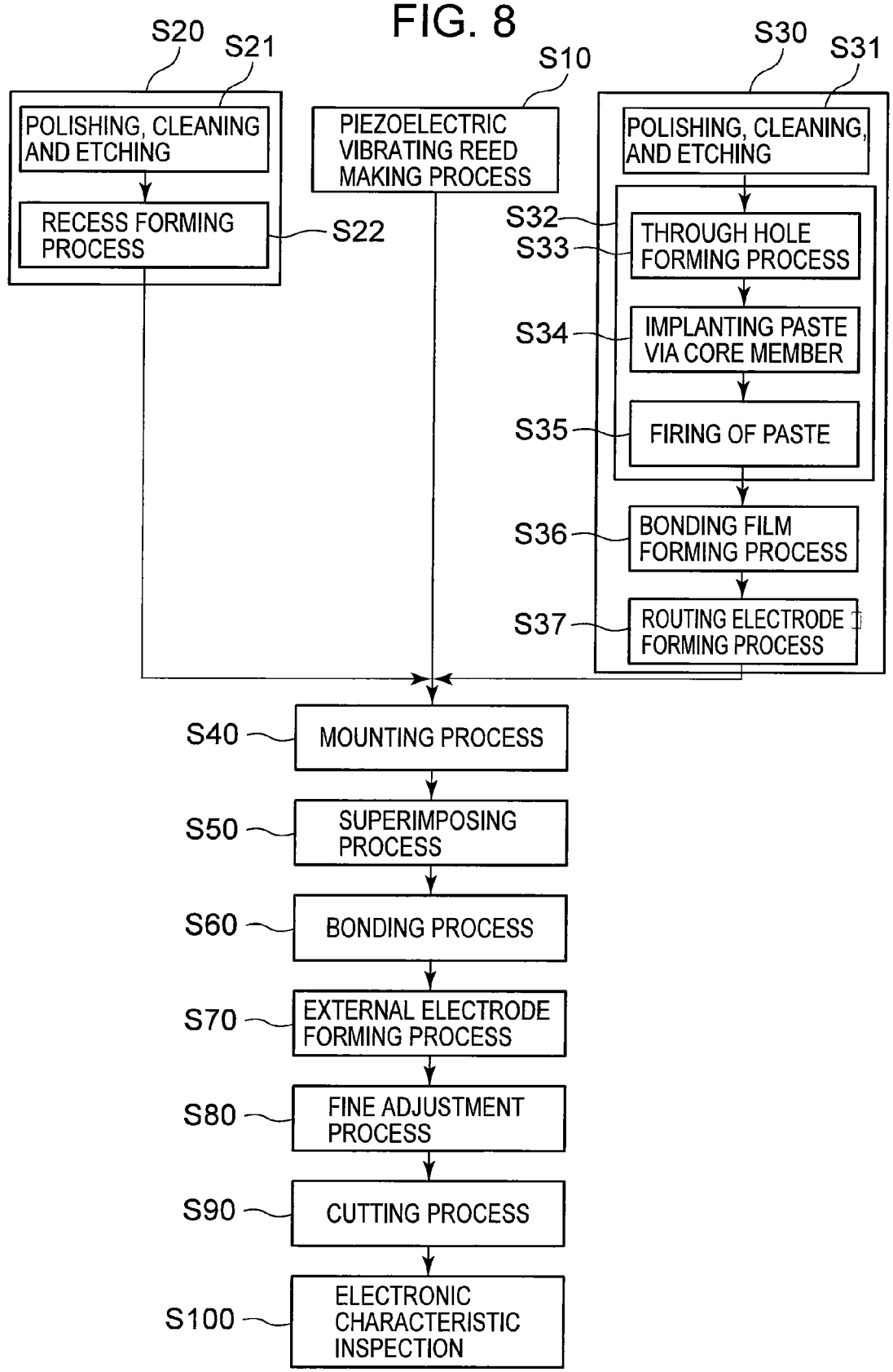
FIG. 8 is a flowchart showing the flow in manufacturing the piezoelectric vibrator shown in FIG. 1.
Figure 9:
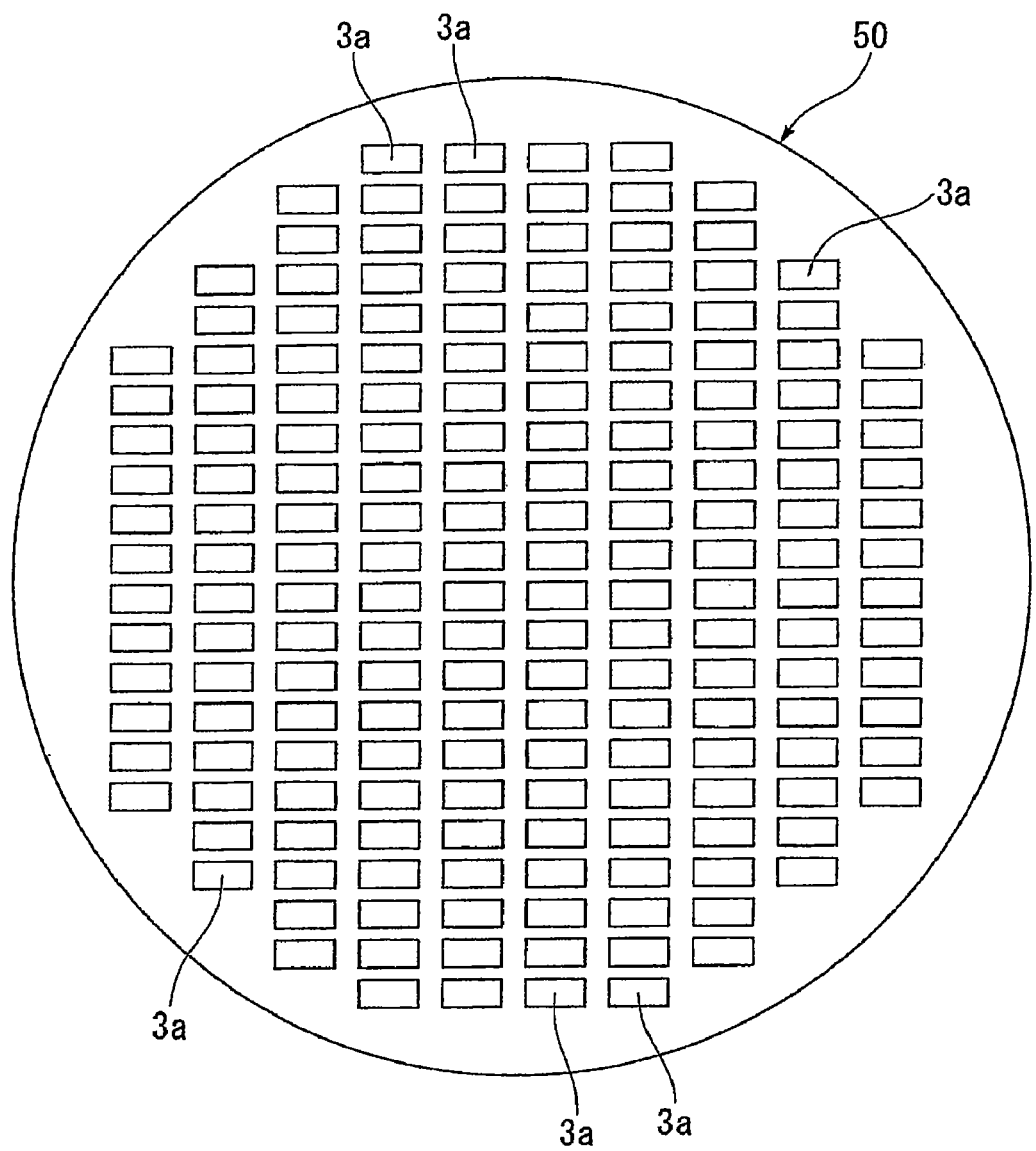
FIG. 9 is a view showing one step in manufacturing piezoelectric vibrators according to the flowchart shown in FIG. 8, and is a view showing the condition where a plurality of recesses are formed in a lid substrate wafer which is an original to be a lid substrate.

Next described is a method for manufacturing a plurality of piezoelectric vibrators 1 mentioned above all at once, by utilizing the base substrate wafer 40 and the lid substrate wafer 50, with reference to the flowchart shown in FIG. 8.

First, a piezoelectric vibration member forming step is attained to form the piezoelectric vibration member 4 shown in FIG. 5 to FIG. 7 (S10). Concretely, first, a rough Lambertian quartz is sliced at a predetermined angle to give a wafer having a predetermined thickness. Subsequently, the wafer is roughly worked by lapping, then the work-affected layer is removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 4 through photolithography, and a metal film is formed and patterned to thereby form the excitation electrode 15, the routing electrodes 19 and 20, the mount electrodes 16 and 17, and the weight metal film 21. Accordingly, a plurality of piezoelectric vibration members 4 are manufactured.

After the piezoelectric vibration members 4 are manufactured, they are processed for rough-tuning of resonance frequency. This is attained by irradiating the rough-tuning film 21*a* of the weight metal film 21 with a laser light to partly evaporate it, thereby changing the weight thereof. Regarding the fine tuning for resonance frequency, the members are processed after mounting. This is described later.

Next, a first wafer forming step is attained for forming a lid substrate wafer 50 to be the lid substrate 3 later up to the state just before anodic bonding (S20). First, soda lime glass is polished to have a predetermined thickness and washed, and then, the work-affected layer of the outermost surface is removed by etching or the like to give a disc-like lid substrate wafer 50 as in FIG. 9 (S21). Next, a recess forming step is attained for forming a plurality of cavity recesses 3*a* in the line direction by etching or the like in the bonding face of the lid substrate wafer 50 (S22). At this stage, the first wafer forming step is finished.

Next, at the same time or in a timing of before or after the above step, a second wafer forming step is attained for forming a base substrate wafer 40 to be the base substrate 2 later up to the state just before anodic bonding (S30). First, soda lime glass is polished to have a predetermined thickness and washed, and then, the work-affected layer of the outermost surface is removed by etching or the like to give a disc-like base substrate wafer 40 (S31). Next, a through-electrode forming step is attained for forming a pair of through-electrodes 32 and 33 in the base substrate wafer 40 (S32). Here, the through-electrode forming step is described in detail.

Figure 10:
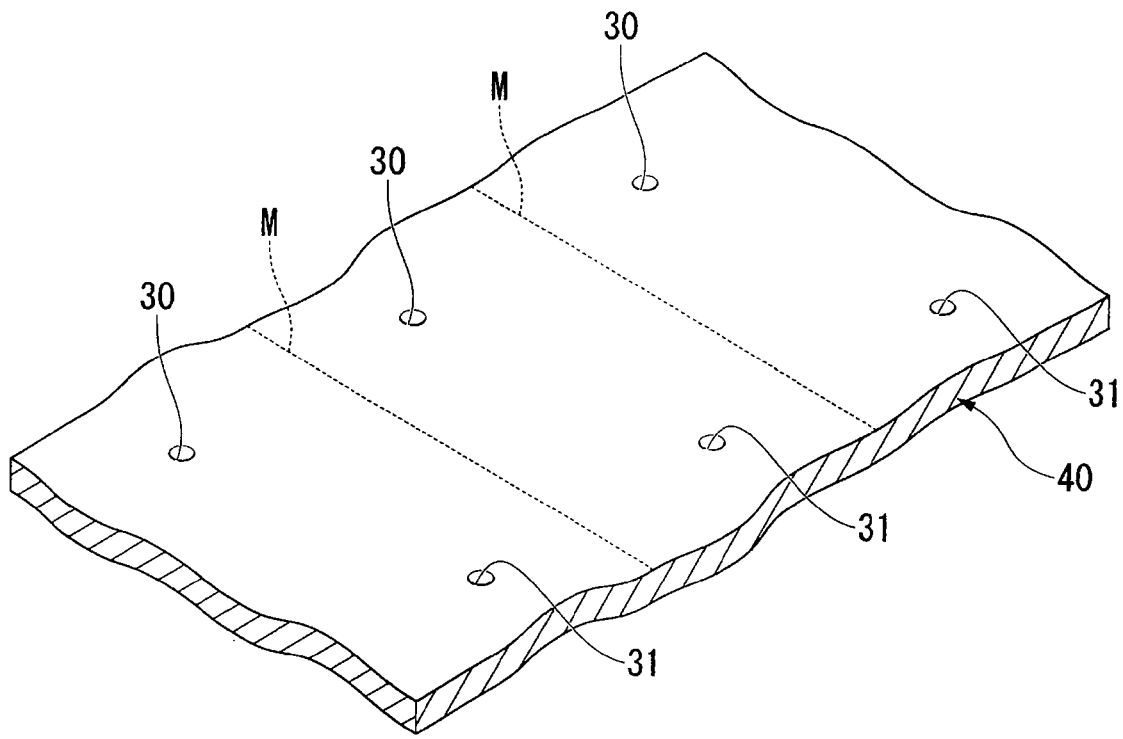
FIG. 10 is a view showing one step in manufacturing piezoelectric vibrators according to the flowchart shown in FIG. 8, and is a view showing the condition where pairs of through-holes are formed in a base substrate wafer which is an original to be a base substrate.

First, as shown in FIG. 10, a through-hole forming step (S33) is attained for forming a plurality of pairs of through-holes 30 and 31 in and through the base substrate wafer 40.

Figure 11:
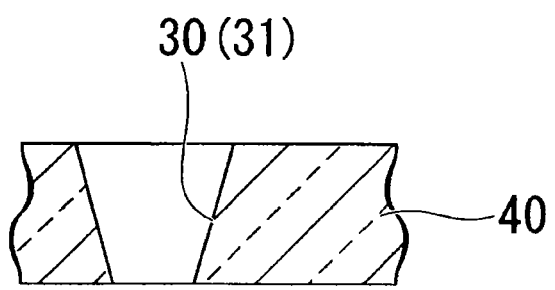
FIG. 11 is a cross-sectional view of the base substrate wafer in the condition shown in FIG. 10.

The dotted line M shown in FIG. 11 means a section line for cutting in the subsequent cutting step. In this step, the upper face of the base substrate wafer 40 is processed, for example, according to a sand-blasting method. Accordingly, tapered through-holes 30 and 31 are formed, of which the hole diameter of the cross section gradually decreases toward the lower face of the base substrate wafer 40, as shown in FIG. 11. A plurality of pairs of through-holes 30 and 31 are so formed as to be housed in the recesses 3a formed in the lid substrate wafer 50, when the two wafers 40 and 50 are overlaid later. Further, they are so positioned that one through-hole 30 can be positioned on the side of the base 12 of the piezoelectric vibration member 4 and the other through-hole 31 can be on the top side of the vibration arms 10 and 11.

Figure 12:
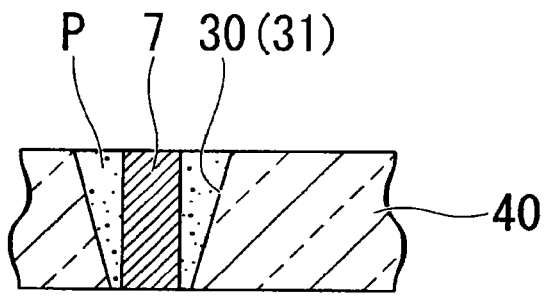
FIG. 12 is a view showing one step in manufacturing piezoelectric vibrators according to the flowchart shown in FIG. 8, and is a view showing the condition where, after the state shown in FIG. 11, a core member is disposed in the through-hole and a paste is implanted.

Subsequently, as shown in FIG. 12, a setting step is attained for disposing a core member 7 which is formed to have two flat ends and a thickness substantially equal to that of the base substrate wafer 40, in those plural through-holes 30 and 31, and implanting a paste P between the core member 7 and the through-hole 30 or 31 (S34). In this step, a paste P is implanted in the space, and therefore the core member 7 does not drop off from the through-holes 30 and 31 owing to the stickiness of the paste P, and the core member 7 can be stabilized in the through-holes 30 and 31. The core member 7 is so controlled that its two ends can be substantially in a flat condition relative to the surface of the base substrate wafer 40.

Subsequently, a firing step is attained for firing and hardening the implanted paste P at a predetermined temperature (S35). Accordingly, the paste P is firmly stuck to the inner face of the through-holes 30 and 31 and to the core member 7. As a result, there are obtained a plurality of pairs of through-electrodes 32 and 33, in which the core member 7 and the paste P are integrally hardened in the through-holes 30 and 31.

The paste P contains an organic matter, and when fired, the organic matter may evaporate away to the result that the volume thereof decreases as compared with that before firing. Accordingly, in case where only the paste P is implanted into the through-holes 30 and 31, then the surface of the paste P may have large depressions after firing.

However, in this embodiment as described above, the core member 7 is disposed in the through-holes 30 and 31, and then the paste P is implanted only in the space between the core member 7 and the through-hole 30 or 31. In other words, the paste P is utilized as a transient role of stabilizing the core member 7 in the through-holes 30 and 31. Accordingly, as compared with that in the case where only the paste P is implanted in the through-holes 30 and 31, the amount of the paste P to be used may be reduced. Therefore, even if the organic matter in the paste P may evaporate in the firing step, the volume reduction of the paste P is small since the amount of the paste P itself is small.

Figure 13:
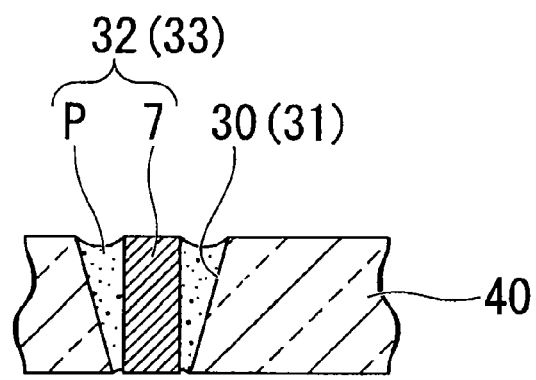
FIG. 13 is a view showing one step in manufacturing piezoelectric vibrators according to the flowchart shown in FIG. 8, and is a view showing the condition where, after the state shown in FIG. 12, the paste is fired and hardened to form a through-electrode.

Accordingly, as shown in FIG. 13, the surface depression to appear after the hardening of the paste P can be on an ignorable level. Therefore, the surface of the base substrate wafer 40, and the two ends of the core member 7 and the surface of the paste P can be substantially in a flat condition. In other words, the surface of the base substrate wafer 40 and the surface of the through-electrodes 32 and 33 can be substantially in a flat face condition. At the time after the firing step, the through-electrode forming step is finished.

Figure 14:
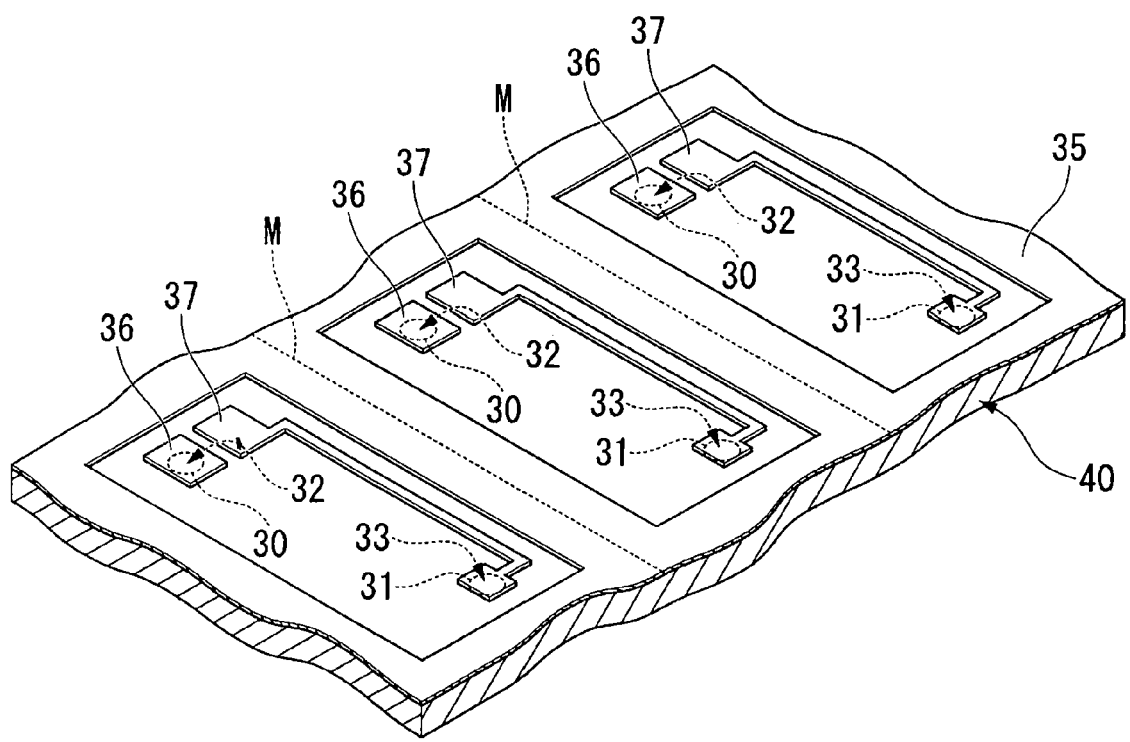
FIG. 14 is a view showing one step in manufacturing piezoelectric vibrators according to the flowchart shown in FIG. 8, and is a view showing the condition where, after the state shown in FIG. 13, a bonding film and a routing electrode are patterned on the upper face of the base substrate wafer.
Figure 15:
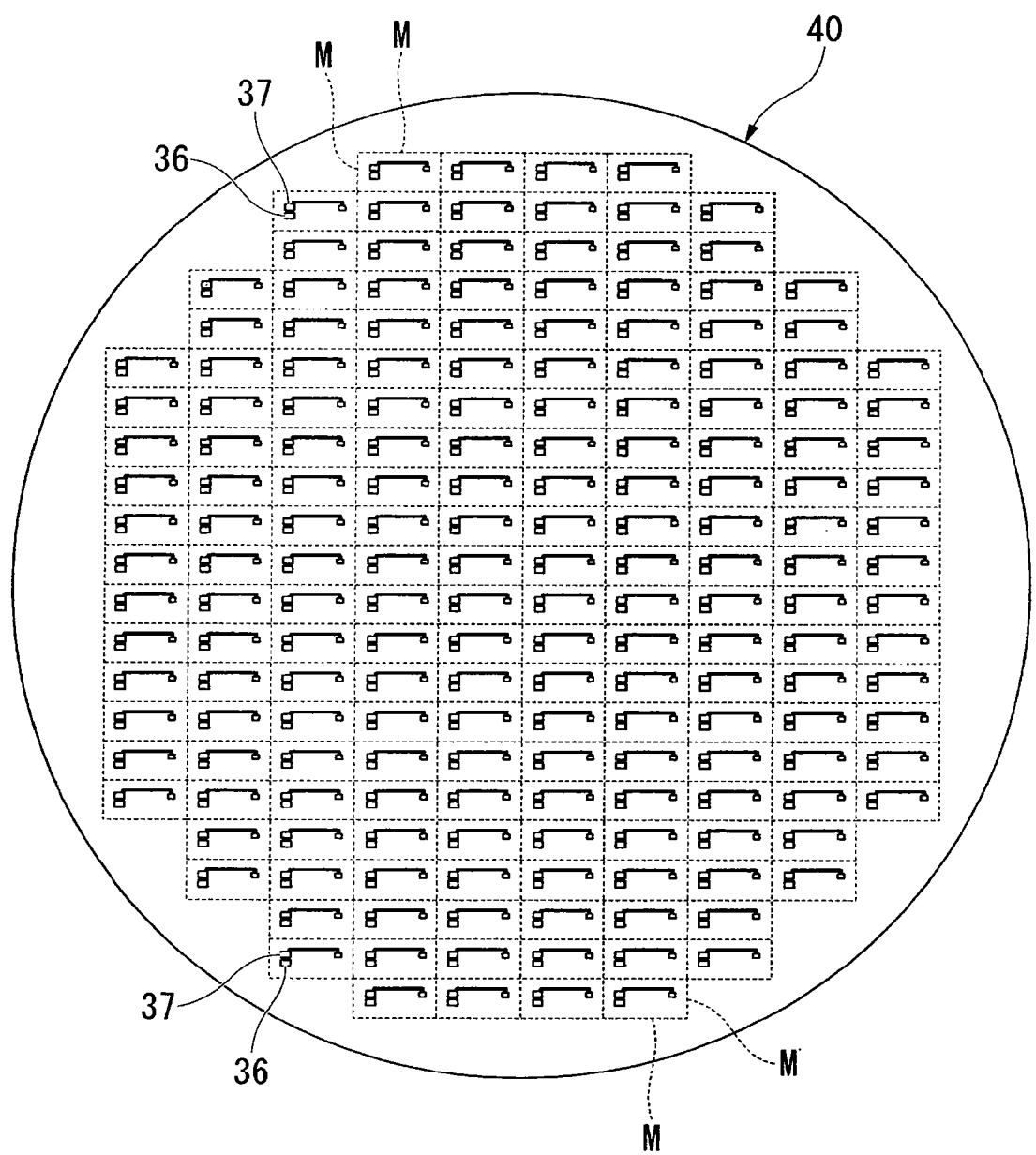
FIG. 15 is an entire view of the base substrate wafer in the state shown in FIG. 14.

Next, a bonding film forming step is attained for forming a bonding film 35 by patterning an electroconductive material on the upper face of the base substrate wafer 40, as shown in FIG. 14 and FIG. 15 (S36); and at the same time, a routing electrode forming step is attained for forming a plurality of routing electrodes 36 and 37 connected electrically with the pair of through-electrodes 32 and 33 (S37). The dotted line M shown in FIG. 14 and FIG. 15 means a section line for cutting in the subsequent cutting step.

In particular, as so mentioned in the above, the through-electrodes 32 and 33 have no depression in the surface thereof and are substantially in a flat condition relative to the upper face of the base substrate wafer 40. Accordingly, the routing electrodes 36 and 37 as patterned on the upper face of the base substrate wafer 40 are kept in airtight contact with the through-electrodes 32 and 33 with no space therebetween. This secures the electric connection between one routing electrode 36 and one through-electrode 32 and the electric connection between the other routing electrode 37 and the other through-electrode 33. At this time, the second wafer forming step is finished.

In FIG. 8, the bonding film forming step (S36) is followed by the routing electrode forming step (S37) as the process sequence; however, in an opposite manner, the routing electrode forming step (S37) may be followed by the bonding film forming step (S36), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 4 onto the upper face of the base substrate wafer 40 via the routing electrodes 36 and 37 (S40). First, a bump B of gold or the like is formed on the pair of routing electrodes 36 and 37. After the base 12 of the piezoelectric vibration member 4 is put on the bump B, the piezoelectric vibration member 4 is pressed against the bump B while the bump B is heated at a predetermined temperature. Accordingly, the piezoelectric vibration member 4 is mechanically supported by the bump B, and the mount electrodes 16 and 17 are electrically connected with the routing electrodes 36 and 37. Therefore, at this time, the pair of excitation electrodes 15 of the piezoelectric vibration member 4 are electrically connected to the pair of through-electrodes 32 and 33, respectively.

In particular, the piezoelectric vibration member 4 is bump-bonded, and therefore it is supported as spaced above from the upper face of the base substrate wafer 40.

After the mounting of the piezoelectric vibration member 4 is finished, an overlaying step is attained for overlaying the base substrate wafer 40 and the lid substrate wafer 50 (S50). Concretely, the two wafers 40 and 50 are aligned in a correct position based on a reference mark or the like (not shown) as an index. Accordingly, the mounted piezoelectric vibration member 4 is kept housed in the cavity C surrounded by the recess 3a formed in the base substrate wafer 40 and the two wafers 40 and 50.

Figure 16:
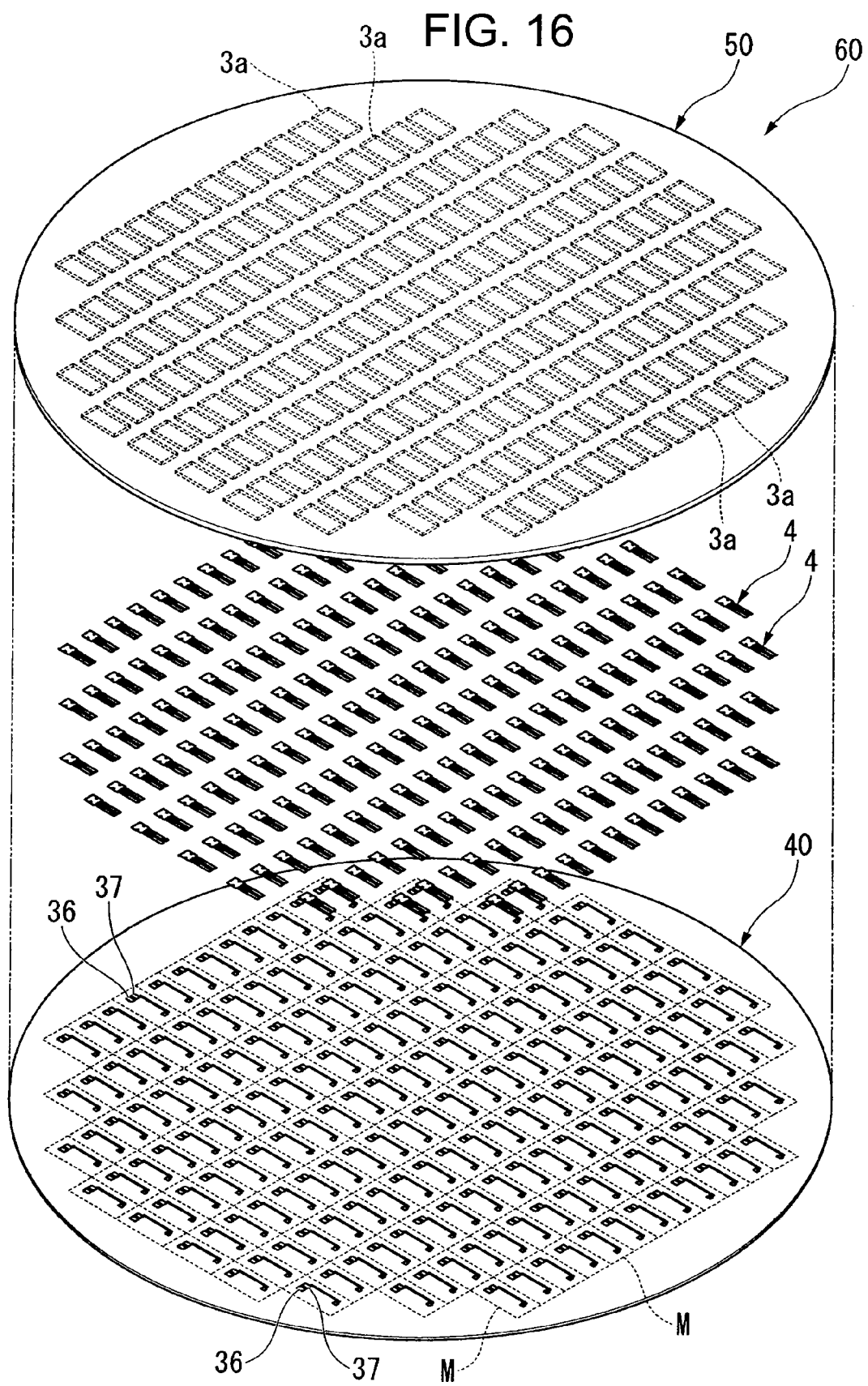
FIG. 16 is a view showing one step in manufacturing piezoelectric vibrators according to the flowchart shown in FIG. 8, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 40 and 50 by putting them in an anodic bonding apparatus (not shown) and applying a predetermined voltage thereto in a predetermined temperature atmosphere (S60). Concretely, a predetermined voltage is applied between the bonding film 35 and the lid substrate wafer 50. With that, there occurs electrochemical reaction in the interface between the bonding film 35 and the lid substrate wafer 50, whereby the two firmly stick to each other to attain anodic bonding therebetween. Accordingly, the piezoelectric vibration member 4 can be sealed up in the cavity C, and a wafer body 60 as shown in FIG. 16 can be obtained in which the base substrate wafer 40 and the lid substrate wafer 50 are bonded to each other. FIG. 16 illustrates an exploded state of the wafer body 60 for facilitating the understating of the view, in which the illustrative constitution of from the base substrate wafer 40 to the bonding film 35 is omitted. The dotted line M shown in FIG. 16 means a section line for cutting in the subsequent cutting step.

In anodic bonding, the through-holes 30 and 31 formed in the base substrate wafer 40 are completely blocked up by the through-electrodes 32 and 33, and therefore, the airtightness inside the cavity C is not broken by the through-holes 30 and 31. In particular, the paste P to constitute the through-electrodes 32 and 33 firmly stick to both the inner face of the through-holes 30 and 31 and the core member 7, and therefore the airtightness inside the cavity C can be surely secured.

After the above-mentioned anodic bonding is finished, an external electrode forming step is attained for forming a plurality of pairs of external electrodes 38 and 39 electrically connected to the pairs of through-electrodes 32 and 33, respectively, by patterning an electroconductive material on the lower face of the base substrate wafer 40 (S70). As a result of this step, the piezoelectric vibration member 4 sealed up in the cavity C can be operated by utilizing the external electrodes 38 and 39.

In particular, also in attaining this step, the through-electrodes 32 and 33 are kept substantially in a flat condition relative to the lower face of the base substrate wafer 40, like in the case of forming the routing electrodes 36 and 37, and therefore the patterned external electrodes 38 and 39 can be kept in airtight contact with the through-electrodes 32 and 33 with no space therebetween. Accordingly, the electric connection between the external electrodes 38 and 39 with the through-electrodes 32 and 33 is secured.

Next, a fine-tuning step is attained for finely tuning the frequency of the individual piezoelectric vibrators 1 sealed up in the cavities C in the state of the wafer body 60 to make it fall within a predetermined range (S80). Concretely, a voltage is applied to the pair of external electrodes 38 and 39 formed on the lower face of the base substrate wafer 40 to thereby vibrate the piezoelectric vibration member 4. Then, with monitoring the frequency, this is irradiated with a laser light from the outside through the lid substrate wafer 50, to thereby evaporate the fine-tuning film 21b of the weight metal film 21. As a result, the weight of the top side of the pair of vibration arms 10 and 11 changes, and therefore the frequency of the piezoelectric vibration member 4 can be finely tuned so as to fall within a predetermined range of a nominal frequency.

After the fine-tuning of frequency is finished, a cutting step is attained for cutting the bonded wafer body 60 to thereby shred it into the individual pieces along the section line M shown in FIG. 16 (S90). As a result, a plurality of two-layer structure-type, surface-mount piezoelectric vibrators 1 as in FIG. 1 can be produced all at once, in which the piezoelectric vibration member 4 is sealed up in the cavity C formed between the base substrate 2 and the lid substrate 3 anodically bonded to each other.

The process sequence may be in an order of the cutting step (S90) of shredding into the individual piezoelectric vibrators 1 followed by the fine-tuning step (S80). However, as so mentioned in the above, in case where the fine-tuning step (S80) is attained previously, then the tuning can be effected in the state of the wafer body 60 and therefore a plurality of piezoelectric vibrators 1 can be finely tuned more efficiently. Accordingly, it is favorable as increasing the throughput.

After this, the internal electric characteristics are inspected (S100). Specifically, the piezoelectric vibration member 4 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 1 is checked for the appearance thereof in point of the dimension and the quality, etc. With that, the manufacture of the piezoelectric vibrator 1 is finished.

In particular, the piezoelectric vibrator 1 of this embodiment has no depression in the surface thereof, in which the through-electrodes 32 and 33 can be formed substantially in a flat condition relative to the base substrate 2, and therefore the through-electrodes 32 and 33 can be surely kept in airtight contact with the routing electrodes 36 and 37 and the external electrodes 38 and 39. As a result, stable electric connection between the piezoelectric vibration member 4 with the external electrodes 38 and 39 can be secured, and the operation performance reliability of the piezoelectric vibrator can be enhanced and the quality thereof can be increased.

Moreover, the through-electrodes 32 and 33 are formed, using the electroconductive core member 7, therefore securing extremely stable electric connection. Further, the airtightness inside the cavity C can be secured, and in this point, the quality of the device can be increased. In addition, since the through-holes 32 and 33 can be formed according to a simple method of using the core member 7 and the paste P, the working process can be simplified. According to the manufacturing method of this embodiment, a plurality of the above-mentioned piezoelectric vibrators 1 can be manufactured all at once, and therefore the manufacturing cost can be reduced.

Second Embodiment

The second embodiment of the invention is described below with reference to FIG. 17 to FIG. 33.

The piezoelectric vibrator 101 of this embodiment is, as shown in FIG. 17 to FIG. 20, a surface-mount piezoelectric vibrator that is formed to have a two-layer laminate boxy shape composed of a base substrate 102 and a lid substrate 103, in which a piezoelectric vibration member 104 is housed in the cavity C inside it.

Figure 20:
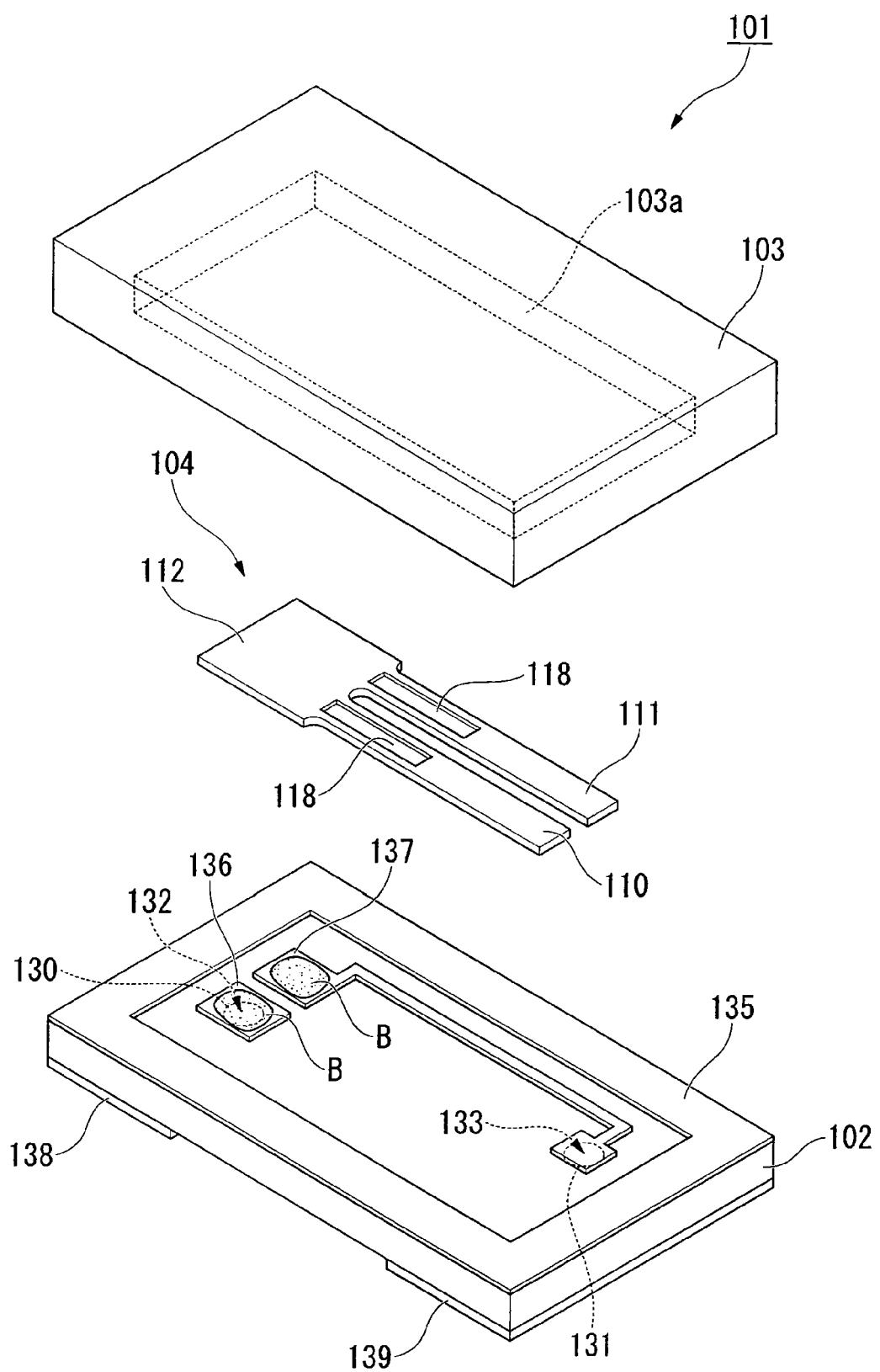
FIG. 20 is a perspective exploded view of the piezoelectric vibrator shown in FIG. 17.

In FIG. 20, an excitation electrode 115, routing electrodes 119 and 120, mount electrodes 116 and 117, and weight metal film 121 to be mentioned below are omitted for facilitating the understating of the view.

Figure 21:
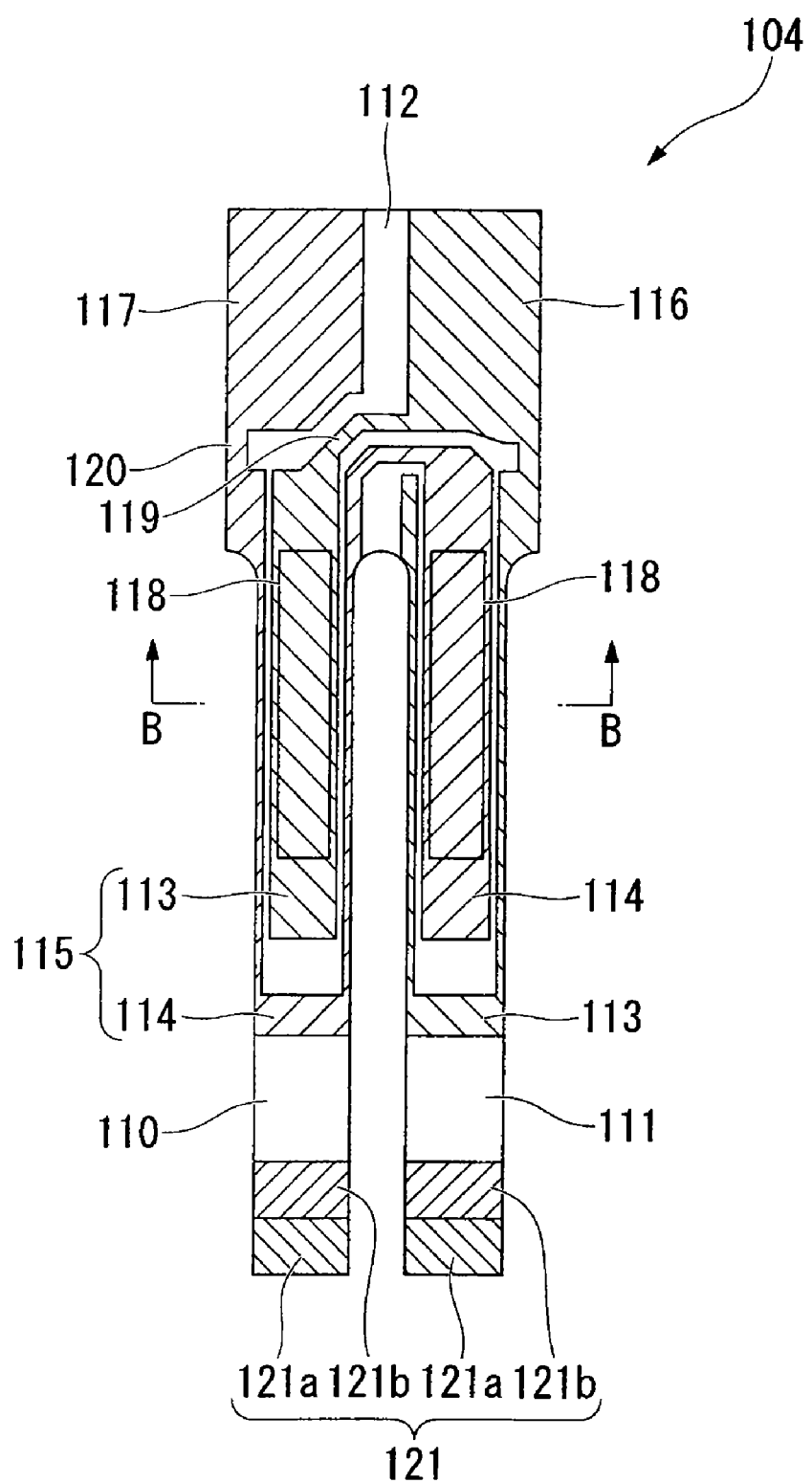
FIG. 21 is a top view of the piezoelectric vibration member constituting the piezoelectric vibrator shown in FIG. 17.
Figure 22:
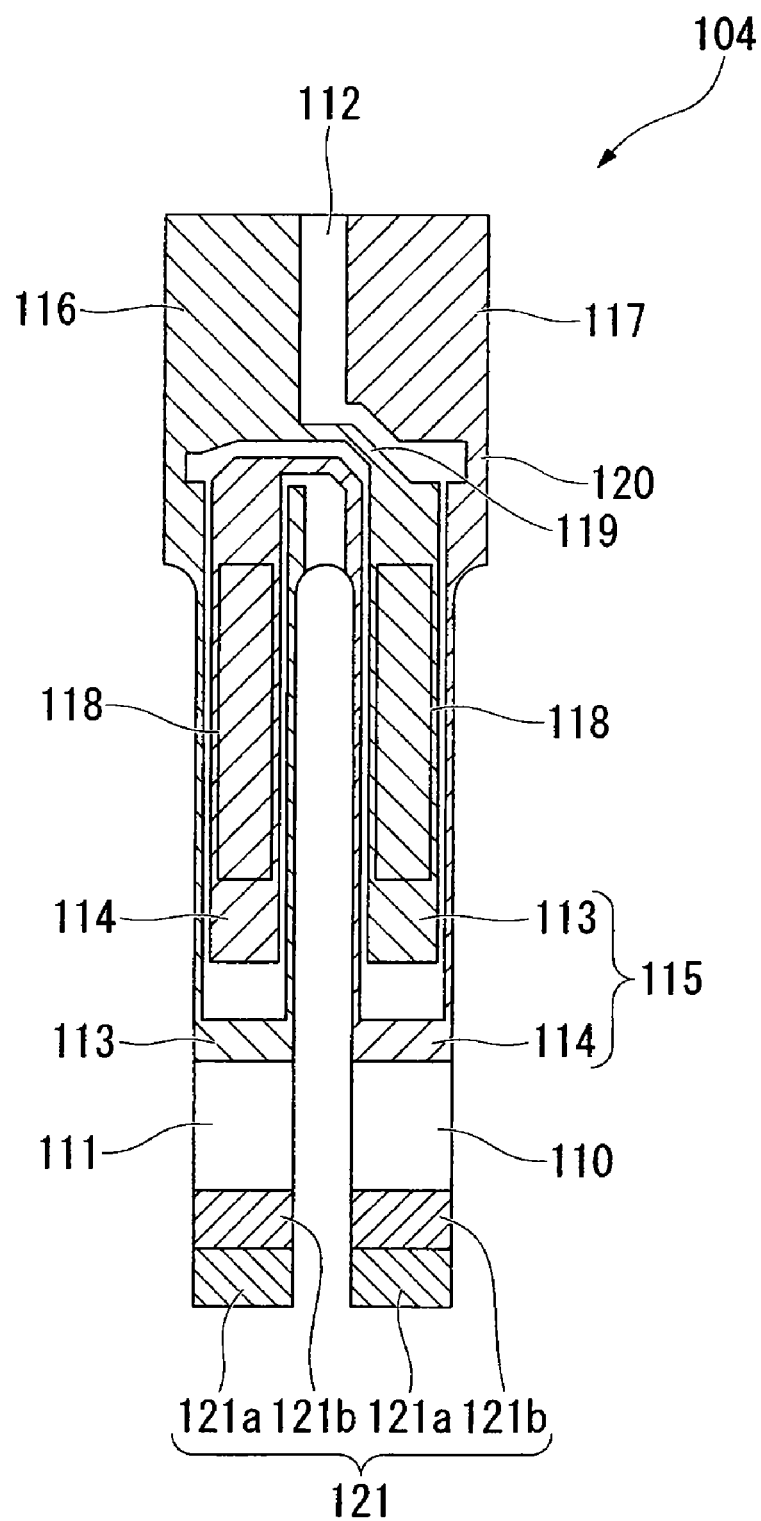
FIG. 22 is a bottom view of the piezoelectric vibration member shown in FIG. 21.
Figure 23:
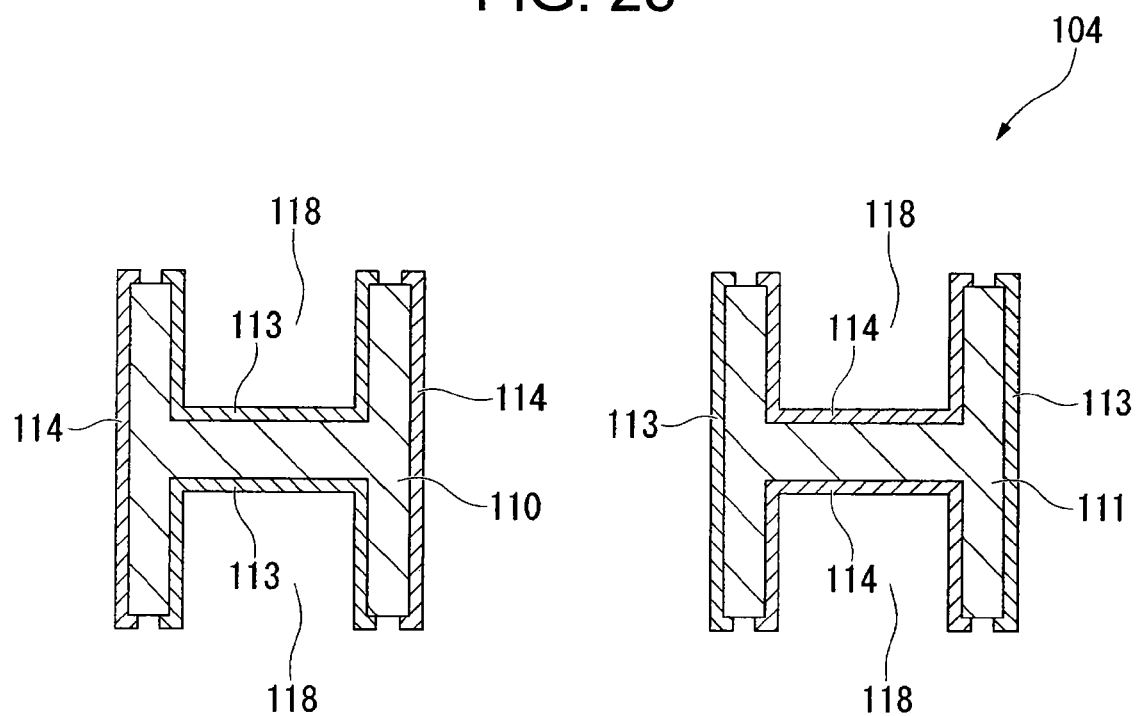
FIG. 23 is a cross-sectional outline view of B-B shown in FIG. 21.

As shown in FIG. 21 to FIG. 23, the piezoelectric vibration member 104 is a tuning fork-like vibration member formed of a piezoelectric material such as crystal, lithium tantalate, lithium niobate or the like, and this vibrates when a predetermined voltage is applied thereto.

The piezoelectric vibration member 104 has a pair of vibration arms 110 and 111 disposed in parallel to each other, a base 112 to integrally fix the base side of the pair of vibration arms 110 and 111, an excitation electrode 115 composed of a first excitation electrode 113 and a second excitation electrode 114 for vibrating the pair of the vibration arms 110 and 111, as formed on the outer surface of the pair of the vibration arms 110 and 111, and mount electrodes 116 and 117 electrically connected with the first excitation electrode 113 and the second excitation electrode 114.

The piezoelectric vibration member 104 in this embodiment comprises, on both the two main faces of the pair of vibration arms 110 and 111, a groove 118 formed along the longitudinal direction of the vibration arms 110 and 111. The groove 118 is formed from the base side to around the intermediate part of the vibration arms 110 and 111.

The excitation electrode 115 composed of the first excitation electrode 113 and the second excitation electrode 114 is an electrode to vibrate the pair of vibration arms 110 and 111 in the direction in which they come near to and get away from each other, at a predetermined resonance frequency, and this is patterned on the outer surface of the pair of vibration arms 110 and 111, as electrically insulated from each other. Concretely, as shown in FIG. 23, the first excitation electrode 113 is formed mainly on the groove 118 of one vibration arm 110 and on the two side faces of the other vibration arm 111; while the second excitation electrode 114 is formed mainly on the two side faces of one vibration arm 110 and on the groove 118 of the other vibration arm 111.

The first excitation electrode 113 and the second excitation electrode 114 are, as shown in FIG. 21 and FIG. 22, electrically connected to the mount electrodes 116 and 117 via the routing electrodes 119 and 120, respectively, on the two main faces of the base 112. The piezoelectric vibration member 104 is given a voltage via the mount electrodes 116 and 117.

The above-mentioned excitation electrode 115, mount electrodes 116 and 117 and routing electrodes 119 and 120 are, for example, formed of a coating film of an electroconductive film of chromium (Cr), nickel (Ni), aluminium (Al), titanium (Ti) or the like.

The top of the pair of vibration arms 110 and 111 is coated with a weight metal film 121 for tuning the vibration condition of the arms themselves within a predetermined frequency range (frequency tuning). The weight metal film 121 is divided into two, a rough-tuning film 121a for use in roughly tuning the frequency and a fine-tuning film 121b for use in finely tuning it. With these rough-tuning film 121a and the fine-tuning film 121b, the frequency is tuned, whereby the frequency of the pair of vibration arms 110 and 111 can be controlled to fall within a range of the nominal frequency of the device.

Figure 19:
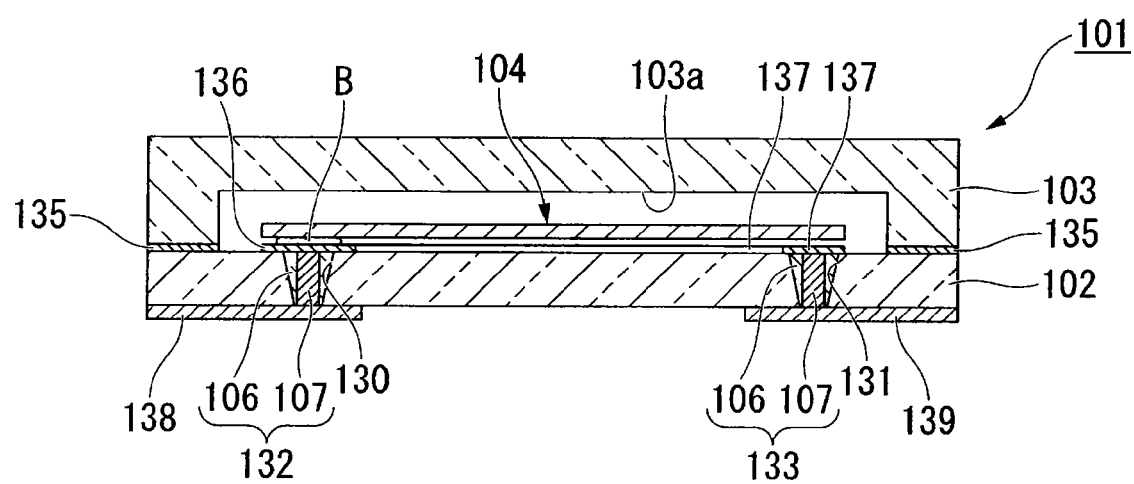
FIG. 19 is a cross-sectional view of the piezoelectric vibrator cut along the line A-A in FIG. 18.

The thus-constituted piezoelectric vibration member 104 is, as shown in FIG. 19 and FIG. 20, bump-bonded to the upper face of the base substrate 102 with a bump B of gold or the like. More concretely, on the two bumps B formed on the routing electrodes 136 and 137 to be mentioned below, as patterned on the upper face of the base substrate 102, a pair of mount electrodes 116 and 117 are bump-bonded as kept in contact with each other. Accordingly, the piezoelectric vibration member 104 is supported as spaced above from the upper face of the base substrate 102, and the mount electrodes 116 and 117 are electrically connected to the routing electrodes 136 and 137, respectively.

Figure 17:
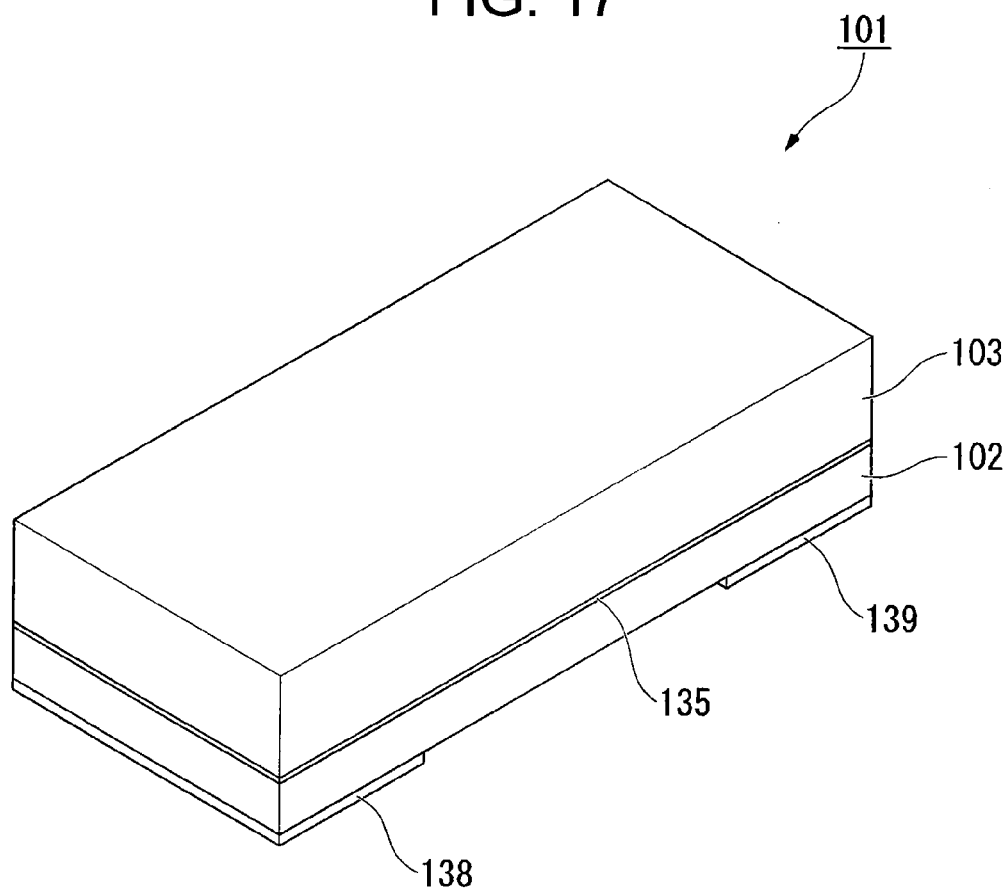
FIG. 17 is a perspective outline view showing the second embodiment of the piezoelectric vibrator of the invention.
Figure 18:
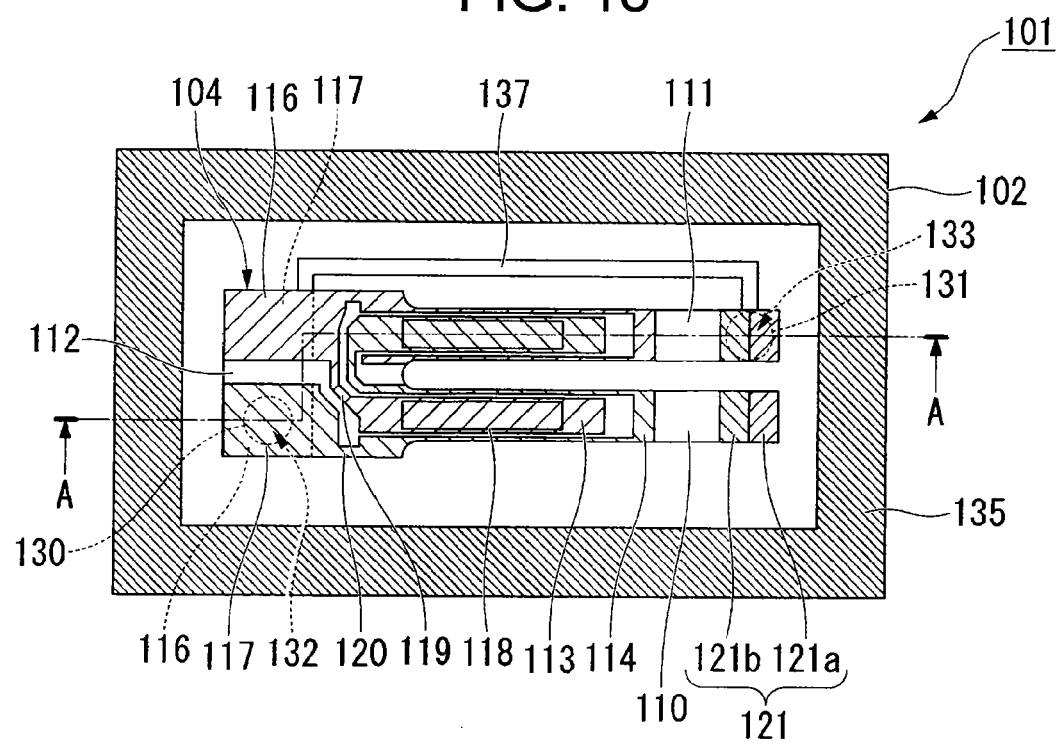
FIG. 18 is an internal configuration view of the piezoelectric vibrator shown in FIG. 17, and is a top view of the piezoelectric vibration member thereof from which the lid substrate was removed.

The lid substrate 103 is a transparent insulating substrate formed of a glass material, for example, soda lime glass; and as shown in FIG. 17, FIG. 19 and FIG. 20, this is shaped to be tabular. On the bonding face side to which the base substrate 102 is bonded, formed is a rectangular recess 103a in which the piezoelectric vibration member 104 is housed. The recess 103a is a cavity recess to be a cavity C to house the piezoelectric vibration member 104 therein when the two substrates 102 and 103 are overlaid. The lid substrate 103 is anodically bonded to the base substrate 102 with the recess 103a kept facing the side of the base substrate 102.

The base substrate 102 is, like the lid substrate 103, a transparent insulating substrate formed of a glass substrate, for example, soda lime glass; and as shown in FIG. 17 to FIG. 20, this is formed to be tabular and have a size capable of being overlaid on the lid substrate 103.

The base substrate 102 is formed to have a pair of through-holes 130 and 131 in and through the base substrate 102. In this case, the pair of through-holes 130 and 131 are so formed as to be housed inside the cavity C. More precisely, the through-holes 130 and 131 in this embodiment are so formed that one through-hole 130 is positioned on the side of the base 112 of the mounted piezoelectric vibration member 104 and the other through-hole 131 is positioned on the top side of the vibration arms 110 and 111.

In this embodiment, a tapered through-hole of which the diameter of the cross section gradually decreases toward the lower face of the base substrate 102 is described as one example; but not limited to this case, the through-hole may also be a straight through-hole that runs straightly through the base substrate 102. Anyhow, the through-hole may be any one that runs through the base substrate 102.

In the pair of through-holes 130 and 131, provided are a pair of through-electrodes 132 and 133 that are so formed to fill up the through-holes 130 and 131. These through-electrodes 132 and 133 are, as shown in FIG. 19, formed of a glass frit (connection member, cylindrical body) 106 and a core member 107 as integrally fixed to the through-holes 130 and 131 by firing. These through-electrodes 132 and 133 play a role of completely blocking up the through-holes 130 and 131 and keeping the airtightness inside the cavity C, and electrically connecting the external electrodes 138 and 139 with the routing electrodes 136 and 137 as described below.

Figure 24:
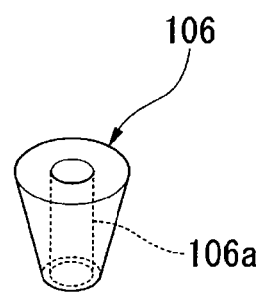
FIG. 24 is a perspective view of the glass frit constituting the through-electrode shown in FIG. 19.

The glass frit 106 is formed of a glass material that is the same as the base substrate 102 and is previously temporary-fired; and as shown in FIG. 24, it is formed to be cylindrical, having two flat ends having a thickness substantially equal to that of the base substrate 102. In other words, a center hole 106a that runs through the glass frit 106 is formed in the center of the glass frit 106. Moreover, in this embodiment, the glass frit 106 is so formed as to have a conical outer shape (having a tapered cross section) in accordance with the shape of the through-holes 130 and 131. The glass frit 106 is fired as implanted in the through-holes 130 and 131, as shown in FIG. 19, and this is firmly fixed to the through-holes 130 and 131.

The core member 107 is an electroconductive core member formed of a metal material to be columnar; and like the glass frit 106, it is formed to have two flat ends and a thickness substantially equal to the thickness of the base substrate 102. The core material 107 is inserted into the center hole 106a of the glass frit 106, and is firmly fixed to the glass frit 106 by firing of the glass frit 106.

Via the electroconductive core member 107, the electric conductivity of the through-electrodes 132 and 133 is secured.

On the upper face side of the base substrate 102 (the bonding face side thereof to which a lid substrate 103 is bonded), an anodic-bonding film 135 and a pair of routing electrodes 136 and 137 are patterned with an electroconductive material (for example, aluminium), as shown in FIG. 17 to FIG. 20. Of those, the bonding film 135 is formed along the peripheral edge of the base substrate 102 so as to surround the recess 103a formed in the lid substrate 103.

The pair of routing electrodes 136 and 137 are so patterned as to electrically connect one through-hole 132 of the pair of through-holes 132 and 133, with one mount electrode 116 of the piezoelectric vibration member 104, and to electrically connect the other through-electrode 133 with the other mount electrode 117 of the piezoelectric vibration member 104.

More precisely, one routing electrode 136 is formed just above one through-electrode 132 so as to be positioned just below the base 112 of the piezoelectric vibration member 104; and the other routing electrode 137 is so formed as to be positioned just above the other through-electrode 133 after drawn from the position adjacent to one routing electrode 136 to the top of the vibration arms 110 and 111 along the vibration arms 110 and 111.

A bump B is formed on the pair of routing electrodes 136 and 137, and via the bump B, the piezoelectric vibration member 104 is mounted. Accordingly, one mount electrode 116 of the piezoelectric vibration member 104 is electrically connected to one through-electrode 132 via one routing electrode 136, and the other mount electrode 117 is electrically connected to the other through-electrode 133 via the other routing electrode 137.

On the lower face of the base substrate 102, formed are external electrodes 138 and 139 to be electrically connected to the pair of through-electrodes 132 and 133, respectively, as shown in FIG. 17, FIG. 19 and FIG. 20. In other words, one external electrode 138 is electrically connected to the first excitation 113 of the piezoelectric vibration member 104 via one through-electrode 132 and one routing electrode 136. The other external electrode 139 is electrically connected to the second excitation electrode 114 of the piezoelectric vibration member 104 via the other through-electrode 133 and the other routing electrode 137.

To operate the thus-constituted piezoelectric vibrator 101, a predetermined driving voltage is applied to the external electrodes 138 and 139 formed on the base substrate 102. Accordingly, a current is applied to the excitation electrode 115 composed of the first excitation electrode 113 and the second excitation electrode 114 of the piezoelectric vibration member 104, whereby the pair of vibration arms 110 and 111 are vibrated at a predetermined frequency in the direction in which they come near to and get away from each other. Based on the vibration of the pair of vibration arms 110 and 111, the vibrator can be used as a time source, a timing source of control signals or the like, a reference signal source, etc.

Figure 25:
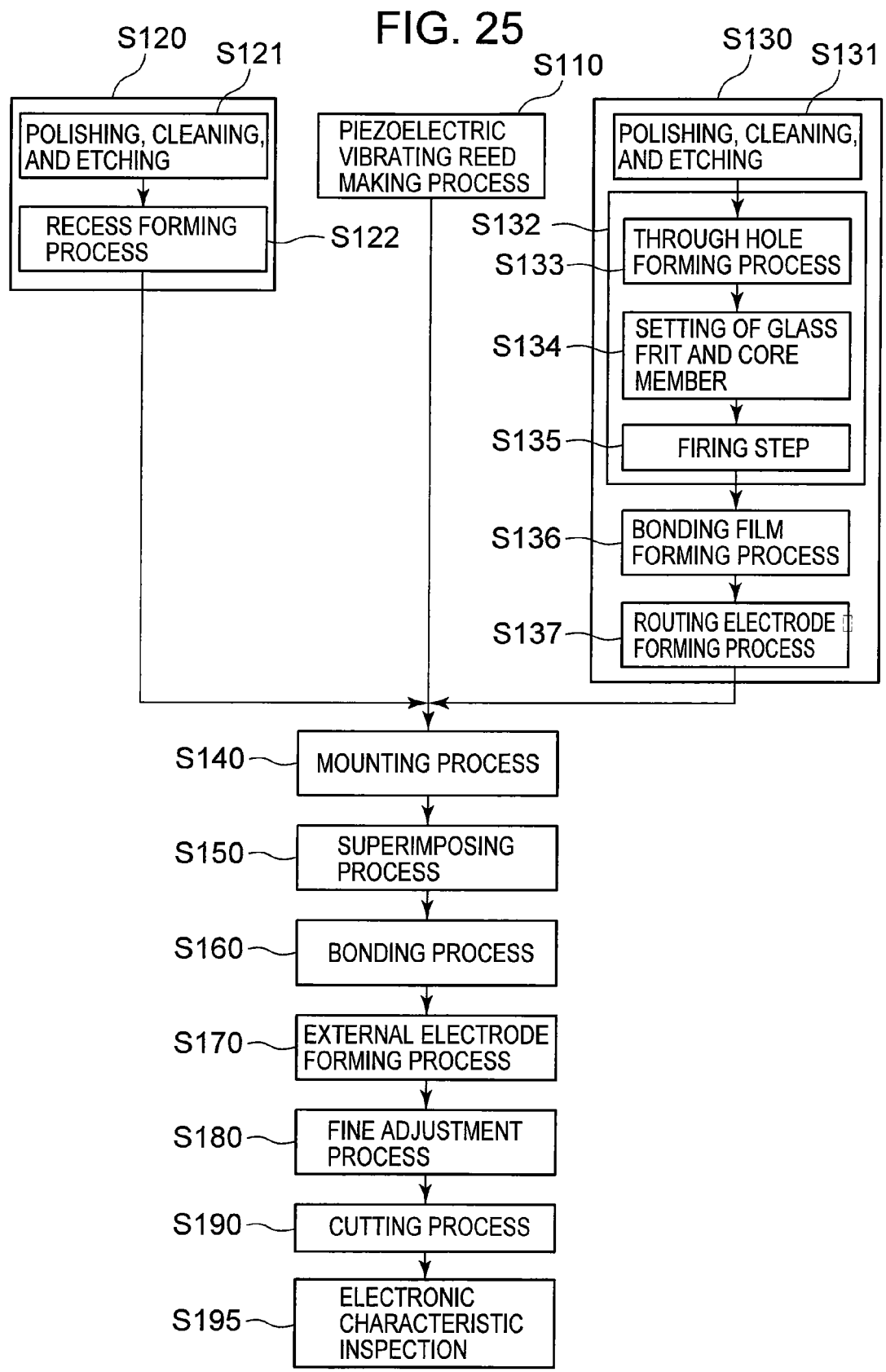
FIG. 25 is a flowchart showing the flow in manufacturing the piezoelectric vibrator shown in FIG. 17.
Figure 26:
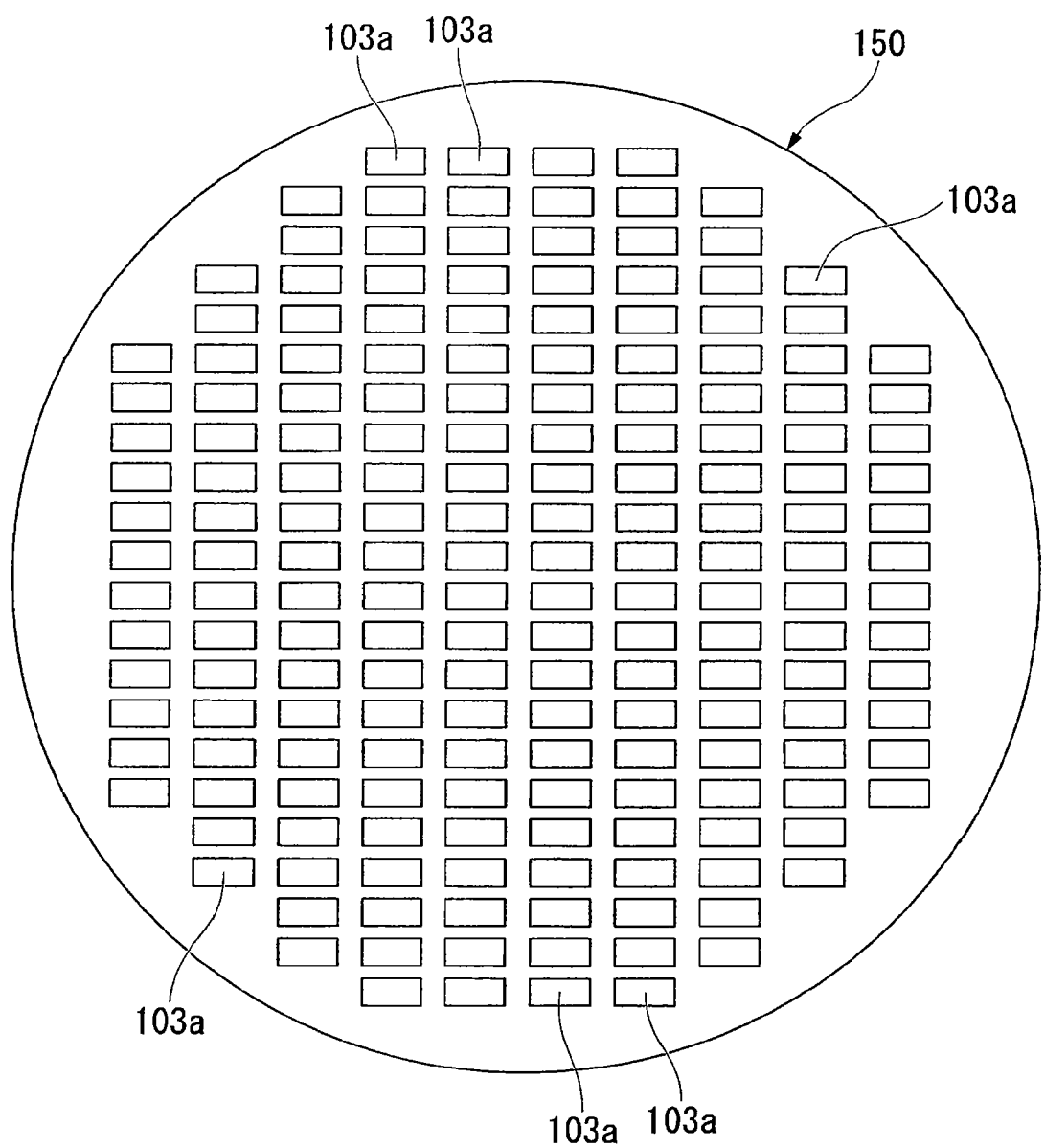
FIG. 26 is a view showing one step in manufacturing piezoelectric vibrators according to the flowchart shown in FIG. 25, and is a view showing the condition where a plurality of recesses are formed in a lid substrate wafer which is an original to be a lid substrate.

Next described is a method for manufacturing a plurality of piezoelectric vibrators 101 mentioned above all at once, by utilizing the base substrate wafer 140 and the lid substrate wafer 150, with reference to the flowchart shown in FIG. 25.

First, a piezoelectric vibration member forming step is attained to form the piezoelectric vibration member 104 shown in FIG. 21 to FIG. 23 (S110). Concretely, first, a rough Lambertian quartz is sliced at a predetermined angle to give a wafer having a predetermined thickness. Subsequently, the wafer was roughly worked by lapping, then the work-affected layer was removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 104 through photolithography, and a metal film is formed and patterned to thereby form the excitation electrode 115, the routing electrodes 119 and 120, the mount electrodes 116 and 117, and the weight metal film 121. Accordingly, a plurality of piezoelectric vibration members 104 are manufactured.

After the piezoelectric vibration members 104 are manufactured, they are processed for rough-tuning of resonance frequency. This is attained by irradiating the rough-tuning film 121a of the weight metal film 121 with a laser light to partly evaporate it, thereby changing the weight thereof. Regarding the fine tuning for resonance frequency, the members are processed after mounting. This is described later.

Next, a first wafer forming step is attained for forming a lid substrate wafer 150 to be the lid substrate 103 later up to the state just before anodic bonding (S120). First, soda lime glass is polished to have a predetermined thickness and washed, and then, the work-affected layer of the outermost surface is removed by etching or the like to give a disc-like lid substrate wafer 150 as in FIG. 26 (S121). Next, a recess forming step is attained for forming a plurality of cavity recesses 103a in the line direction by etching or the like in the bonding face of the lid substrate wafer 150 (S122). At this stage, the first wafer forming step is finished.

Next, at the same time or in a timing of before or after the above step, a second wafer forming step is attained for forming a base substrate wafer 140 to be the base substrate 102 later up to the state just before anodic bonding (S130). First, soda lime glass is polished to have a predetermined thickness and washed, and then, the work-affected layer of the outermost surface is removed by etching or the like to give a disc-like base substrate wafer 140 (S131). Next, a through-electrode forming step is attained for forming a pair of through-electrodes 132 and 133 in the base substrate wafer 140 (S132). Here, the through-electrode forming step is described in detail.

Figure 27:
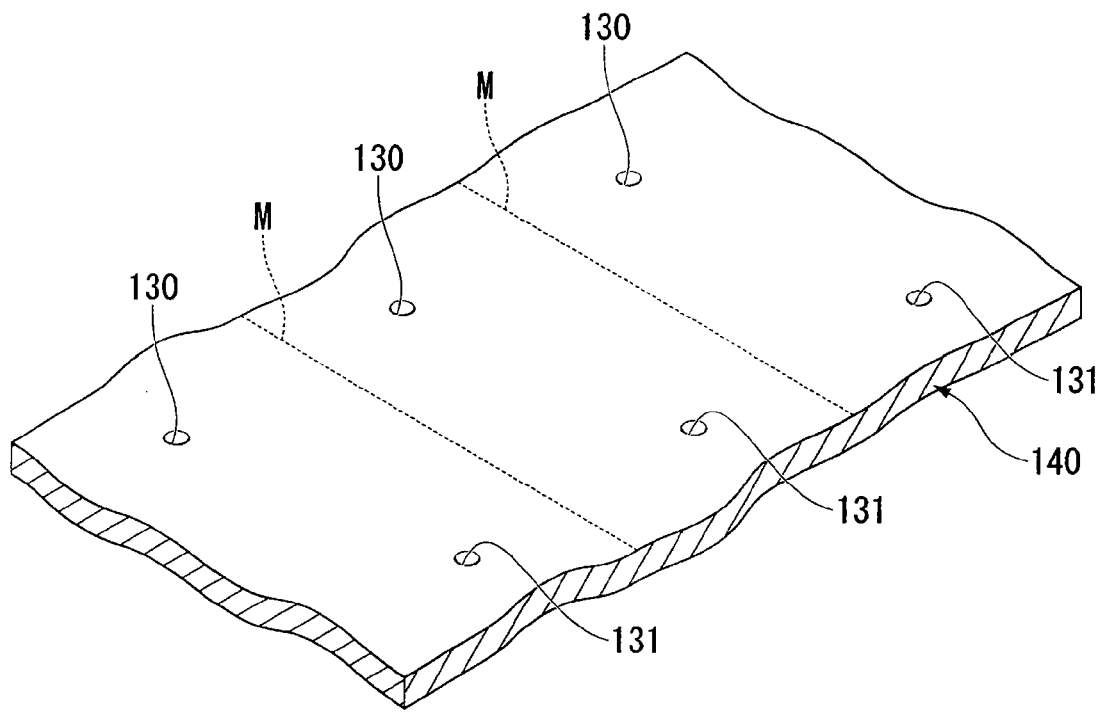
FIG. 27 is a view showing one step in manufacturing piezoelectric vibrators according to the flowchart shown in FIG. 25, and is a view showing the condition where pairs of through-holes are formed in a base substrate wafer which is an original to be a base substrate.
Figure 28:
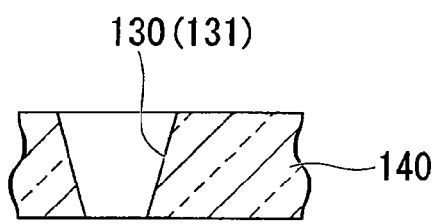
FIG. 28 is a cross-sectional view of the base substrate wafer in the condition shown in FIG. 27.

First, as shown in FIG. 27, a through-hole forming step (S133) is attained for forming a plurality of pairs of through-holes 130 and 131 in and through the base substrate wafer 140. The dotted line M shown in FIG. 27 means a section line for cutting in the subsequent cutting step. In this step, the upper face of the base substrate wafer 140 is processed, for example, according to a sand-blasting method. Accordingly, tapered through-holes 130 and 131 are formed, of which the hole diameter of the cross section gradually decreases toward the lower face of the base substrate wafer 140, as shown in FIG. 28. A plurality of pairs of through-holes 130 and 131 are so formed as to be housed in the recesses 103a formed in the lid substrate wafer 150, when the two wafers 140 and 150 are overlaid. Further, they are so positioned that one through-hole 130 can be positioned on the side of the base 112 of the piezoelectric vibration member 104 and the other through-hole 131 can be on the top side of the vibration arms 110 and 111.

Figure 29:
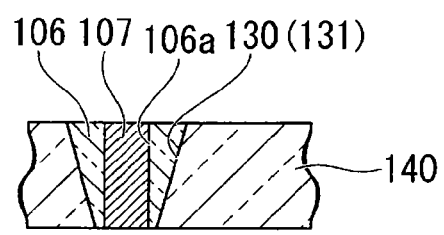
FIG. 29 is a view showing one step in manufacturing piezoelectric vibrators according to the flowchart shown in FIG. 25, and is a view showing the condition where, after the state shown in FIG. 28, a glass frit is implanted in the through-hole and a core member is inserted into the center hole of the glass frit.

Subsequently, as shown in FIG. 29, a setting step is attained for implanting a glass frit 106 which is formed to have two flat ends and a thickness substantially equal to that of the base substrate wafer 140, in those plural through-holes 130 and 131, and inserting an electroconductive core member 107 which is formed to have two flat ends and a thickness substantially equal to that of the base substrate wafer 140, into the center hole 106a of the glass frit 106 (S134). In this case, the glass frit 106 and the core member 107 are so controlled that the both the two ends thereof can be substantially in a flat condition relative to the surface of the base substrate wafer 140.

Subsequently, a firing step is attained for firing the implanted glass fit 106 at a predetermined temperature (S135). Accordingly, the through-holes 130 and 131, the glass frit 106 implanted in the through-holes 130 and 131, and the core member 107 inserted into the glass frit 106 firmly stick to each other. As a result, there are obtained a plurality of pairs of through-electrodes 132 and 133 in which the glass frit 106 and the core member 107 are integrally fixed together.

In particular, in forming the through-electrodes 132 and 133, a paste is not used but the glass frit 106 and the electroconductive core member 107 are used to form the through-electrodes 132 and 133, different from conventional ones. If a paste is used, then the organic matter in the paste may evaporate away during firing and the volume of the paste may greatly reduce as compared with that before firing. As a result, in case where only a paste is implanted in the through-holes 130 and 131, the paste surface may have large depressions after firing. However, as so mentioned in the above, a paste is not used but the glass frit 106 and the core member 107 are used, and therefore there is no risk of forming any large depressions in the surface after firing. There is a possibility that the volume of the glass frit 106 may slightly reduce by firing; however, differing from the case with a paste, the reduction is not so much remarkable and the resulting depressions can be on an ignorable level.

Figure 30:
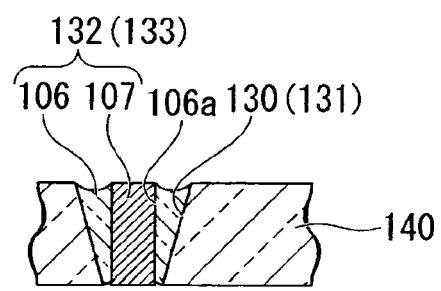
FIG. 30 is a view showing one step in manufacturing piezoelectric vibrators according to the flowchart shown in FIG. 25, and is a view showing the condition where, after the state shown in FIG. 29, the glass frit is fired to form a through-electrode.

Accordingly, the surface of the base substrate wafer 140 and the two ends of the glass frit 106 and the core member 107 can be substantially in a flat condition after firing, as shown in FIG. 30. In other words, the surface of the base substrate wafer 140 and the surface of the through-electrodes 132 and 133 can be substantially in a flat condition. At the time after the firing step, the through-electrode forming step is finished.

Figure 31:
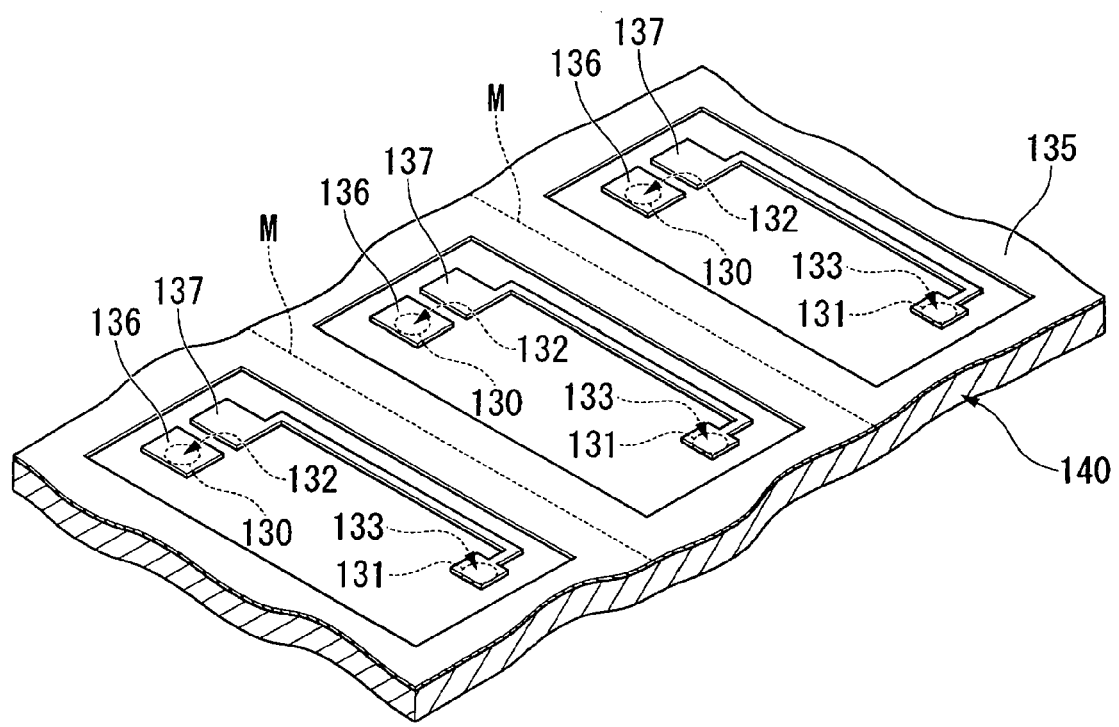
FIG. 31 is a view showing one step in manufacturing piezoelectric vibrators according to the flowchart shown in FIG. 25, and is a view showing the condition where, after the state shown in FIG. 30, a bonding film and a routing electrode are patterned on the upper face of the base substrate wafer.
Figure 32:
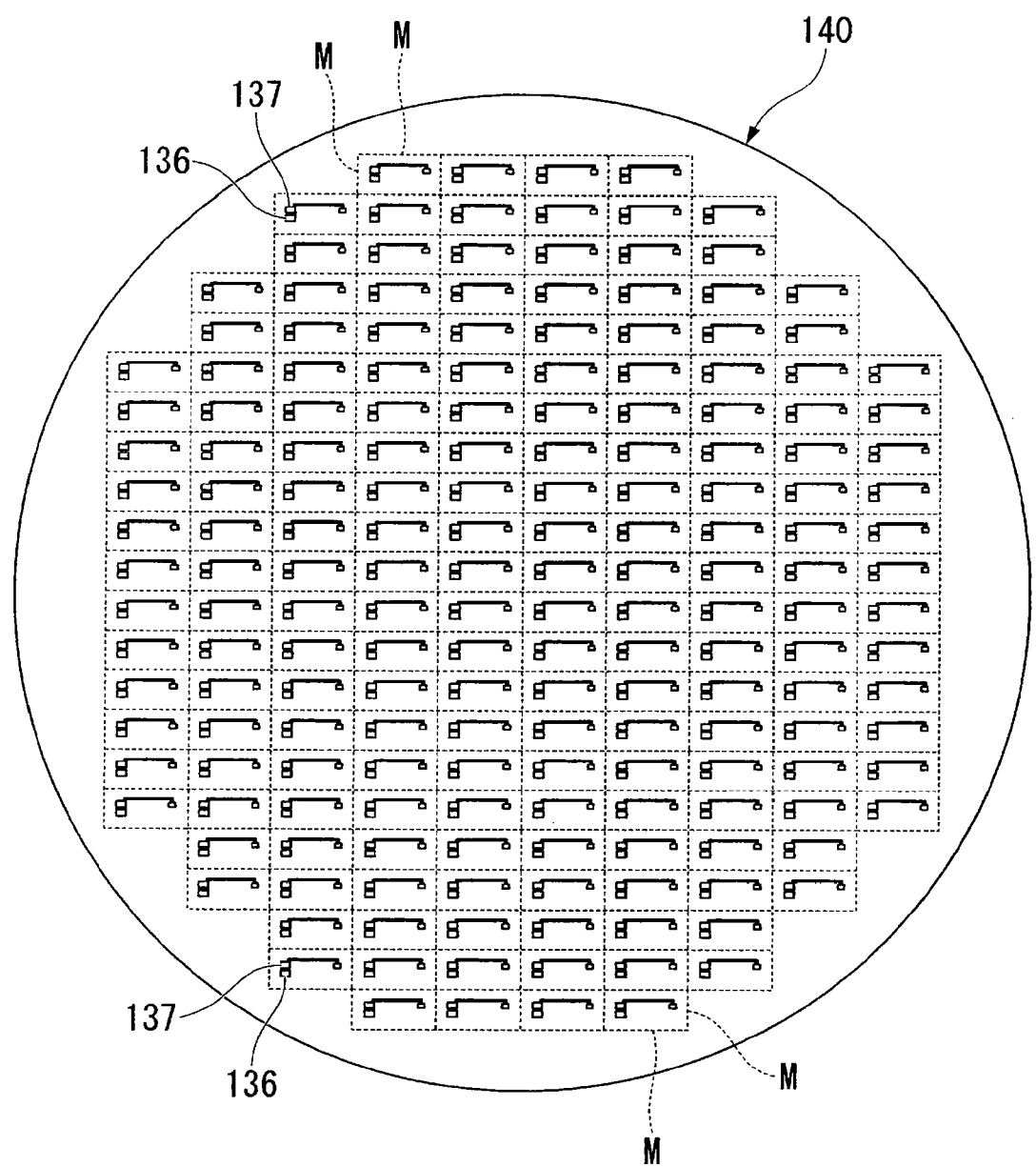
FIG. 32 is an entire view of the base substrate wafer in the state shown in FIG. 31.

Next, a bonding film forming step is attained for forming a bonding film 135 by patterning an electroconductive material on the upper face of the base substrate wafer 140, as shown in FIG. 31 and FIG. 32 (S136); and at the same time, a routing electrode forming step is attained for forming a plurality of routing electrodes 136 and 137 connected electrically with the pair of through-electrodes 132 and 133 (S137). The dotted line M shown in FIG. 31 and FIG. 32 means a section line for cutting in the subsequent cutting step.

In particular, as so mentioned in the above, the through-electrodes 132 and 133 are substantially in a flat condition relative to the upper face of the base substrate wafer 140. Accordingly, the routing electrodes 136 and 137 as patterned on the upper face of the base substrate wafer 140 are kept in airtight contact with the through-electrodes 132 and 133 with no space therebetween. This secures the electric connection between one routing electrode 136 and one through-electrode 132 and the electric connection between the other routing electrode 137 and the other through-electrode 133. At this time, the second wafer forming step is finished.

In FIG. 25, the bonding film forming step (S136) is followed by the routing electrode forming step (S137) as the process sequence; however, in an opposite manner, the routing electrode forming step (S137) may be followed by the bonding film forming step (S136), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 104 onto the upper face of the base substrate wafer 140 via the routing electrodes 136 and 137 (S140). First, a bump B of gold or the like is formed on the pair of routing electrodes 136 and 137. After the base 112 of the piezoelectric vibration member 104 is put on the bump B, the piezoelectric vibration member 104 is pressed against the bump B while the bump B is heated at a predetermined temperature. Accordingly, the piezoelectric vibration member 104 is mechanically supported by the bump B, and the mount electrodes 116 and 117 are electrically connected with the routing electrodes 136 and 137. Therefore, at this time, the pair of excitation electrodes 115 of the piezoelectric vibration member 104 are electrically connected to the pair of through-electrodes 132 and 133, respectively.

In particular, the piezoelectric vibration member 104 is bump-bonded, and therefore it is supported as spaced above from the upper face of the base substrate wafer 140.

After the mounting of the piezoelectric vibration member 104 is finished, an overlaying step is attained for overlaying the base substrate wafer 140 and the lid substrate wafer 150 (S150). Concretely, the two wafers 140 and 150 are aligned in a correct position based on a reference mark or the like (not shown) as an index. Accordingly, the mounted piezoelectric vibration member 104 is kept housed in the cavity C surrounded by the recess 103a formed in the base substrate wafer 140 and the two wafers 140 and 150.

After the overlaying step, a bonding step is attained for anodically bonding the overlaid two wafers 140 and 150 by putting them in an anodic bonding apparatus (not shown) and applying a predetermined voltage thereto in a predetermined temperature atmosphere (S160). Concretely, a predetermined voltage is applied between the bonding film 135 and the lid substrate wafer 150. With that, there occurs electrochemical reaction in the interface between the bonding film 135 and the lid substrate wafer 150, whereby the two firmly stick to each other to attain anodic bonding therebetween. Accordingly, the piezoelectric vibration member 104 can be sealed up in the cavity C, and a wafer body 160 as shown in FIG. 33 can be obtained in which the base substrate wafer 140 and the lid substrate wafer 150 are bonded to each other.

Figure 33:
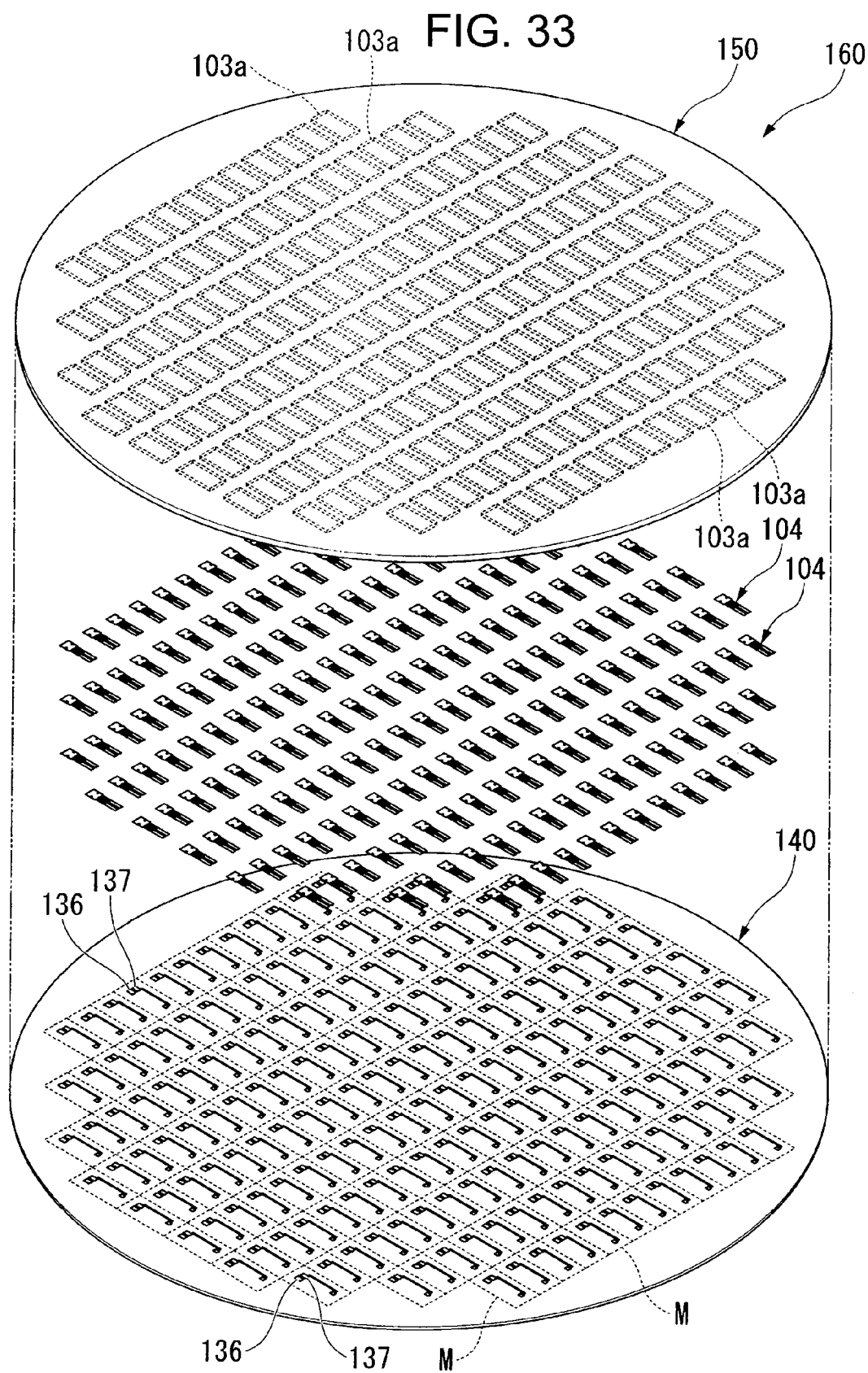
FIG. 33 is a view showing one step in manufacturing piezoelectric vibrators according to the flowchart shown in FIG. 25, and is a perspective exploded view of the wafer body in which the base substrate wafer and the lid substrate wafer are anodically-bonded and the piezoelectric vibration member is housed in the cavity.

FIG. 33 illustrates an exploded state of the wafer body 160 for facilitating the understating of the view, in which the illustrative constitution of from the base substrate wafer 140 to the bonding film 135 is omitted. The dotted line M shown in FIG. 33 means a section line for cutting in the subsequent cutting step.

In anodic bonding, the through-holes 130 and 131 formed in the base substrate wafer 140 are completely blocked up by the through-electrodes 132 and 133, and therefore, the airtightness inside the cavity C is not broken by the through-holes 130 and 131. In particular, the glass frit 106 and the core member 107 are integrally fixed together by firing and these firmly stick to the through-holes 130 and 131, therefore securing the airtightness inside the cavity C.

After the above-mentioned anodic bonding is finished, an external electrode forming step is attained for forming a plurality of pairs of external electrodes 138 and 139 electrically connected to the pairs of through-electrodes 132 and 133, respectively, by patterning an electroconductive material on the lower face of the base substrate wafer 140 (S170). As a result of this step, the piezoelectric vibration member 104 sealed up in the cavity C can be operated by utilizing the external electrodes 138 and 139.

In particular, also in attaining this step, the through-electrodes 132 and 133 are kept substantially in a flat condition relative to the lower face of the base substrate wafer 140, like in the case of forming the routing electrodes 136 and 137, and therefore the patterned external electrodes 138 and 139 can be kept in airtight contact with the through-electrodes 132 and 133 with no space therebetween. Accordingly, the electric connection between the external electrodes 138 and 139 with the through-electrodes 132 and 133 is secured.

Next, a fine-tuning step is attained for finely tuning the frequency of the individual piezoelectric vibrators 101 sealed up in the cavities C in the state of the wafer body 160 to make it fall within a predetermined range (S180). Concretely, a voltage is applied to the pair of external electrodes 138 and 139 formed on the lower face of the base substrate wafer 140 to thereby vibrate the piezoelectric vibration member 104. Then, with monitoring the frequency, this is irradiated with a laser light from the outside through the lid substrate wafer 150, to thereby evaporate the fine-tuning film 121b of the weight metal film 121. As a result, the weight of the top side of the pair of vibration arms 110 and 111 changes, and therefore the frequency of the piezoelectric vibration member 104 can be finely tuned so as to fall within a predetermined range of a nominal frequency.

After the fine-tuning of frequency is finished, a cutting step is attained for cutting the bonded wafer body 160 to thereby shred it into the individual pieces along the section line M shown in FIG. 33 (S190). As a result, a plurality of two-layer structure-type, surface-mount piezoelectric vibrators 101 as in FIG. 17 can be produced all at once, in which the piezoelectric vibration member 104 is sealed up in the cavity C formed between the base substrate 102 and the lid substrate 103 anodically bonded to each other.

The process sequence may be in an order of the cutting step (S190) of shredding into the individual piezoelectric vibrators 101 followed by the fine-tuning step (S180). However, as so mentioned in the above, in case where the fine-tuning step (S180) is attained previously, then the tuning can be effected in the state of the wafer body 160 and therefore a plurality of piezoelectric vibrators 101 can be finely tuned more efficiently. Accordingly, it is favorable as increasing the throughput.

After this, the internal electric characteristics are inspected (S195). Specifically, the piezoelectric vibration member 104 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 101 is checked for the appearance thereof in point of the dimension and the quality, etc. With that, the manufacture of the piezoelectric vibrator 101 is finished.

In particular, the piezoelectric vibrator 101 of this embodiment has no depression in the surface thereof, in which the through-electrodes 132 and 133 can be formed substantially in a flat condition relative to the base substrate 102, and therefore the through-electrodes 132 and 133 can be surely kept in airtight contact with the routing electrodes 136 and 137 and the external electrodes 138 and 139. As a result, stable electric connection between the piezoelectric vibration member 104 with the external electrodes 138 and 139 can be secured, and the operation performance reliability of the piezoelectric vibrator can be enhanced and the quality thereof can be increased. Moreover, the through-electrodes 132 and 133 are formed, using the electroconductive core member 107, therefore securing extremely stable electric connection.

Further, the airtightness inside the cavity C can be secured, and in this point, the quality of the device can be increased. In addition, since the glass frit 106 in this embodiment is previously temporary-fired before firing, it hardly deforms or its volume hardly reduces in the step of firing. Accordingly, high-quality through-electrodes 132 and 133 can be formed, and the airtightness inside the cavity C can be more surely secured. Therefore, the quality of the piezoelectric vibrator 101 can be further increased.

According to the manufacturing method of this embodiment, a plurality of the above-mentioned piezoelectric vibrators 101 can be manufactured all at once, and therefore the manufacturing cost can be reduced.

Figure 34:
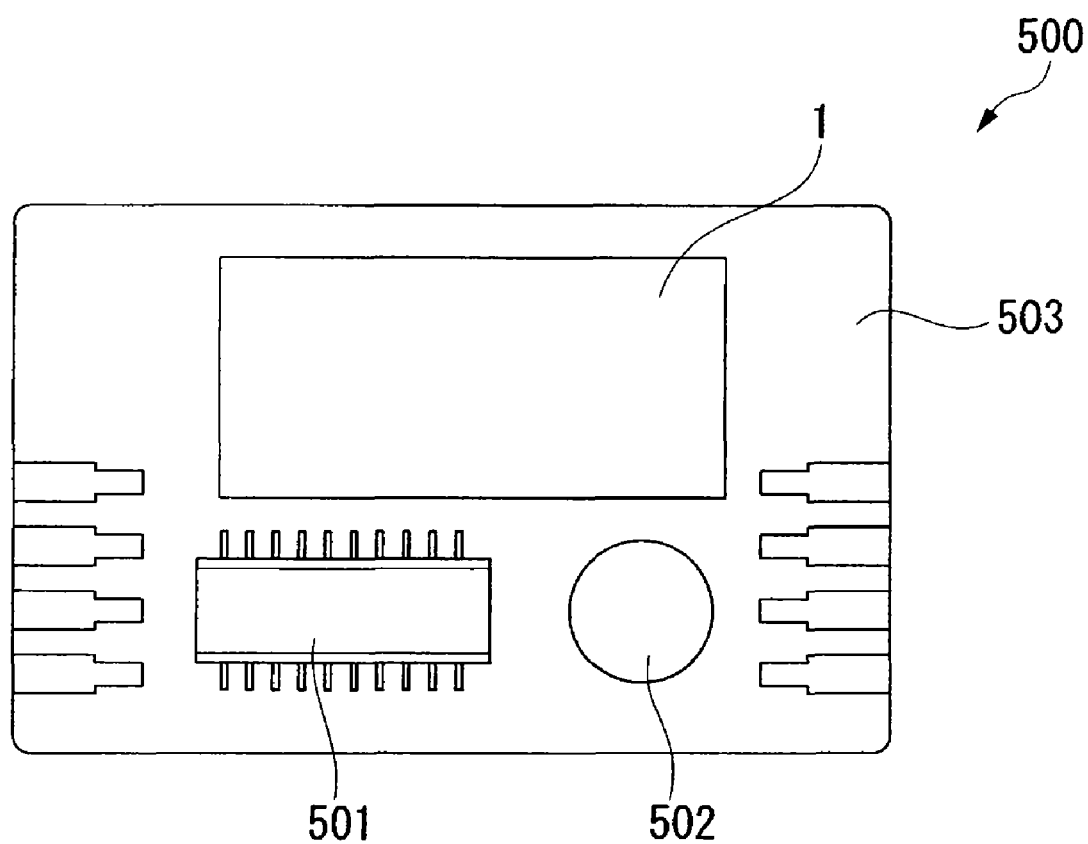
FIG. 34 is a configuration view showing one embodiment of the oscillator of the invention.

Next described is one embodiment of the oscillator of the invention, with reference to FIG. 34. This embodiment is to illustrate an oscillator that comprises the piezoelectric vibrator 1 of the first embodiment, as one example.

The oscillator 500 of this embodiment comprises the piezoelectric vibrator 1 electrically connected to an integrated circuit 501 to be an oscillation member therein, as shown in FIG. 34. The oscillator 500 is provided with a substrate 503 on which an electronic part 502 such as a capacitor or the like is mounted. On the substrate 503, mounted is the above-mentioned integrated circuit 501 for oscillator, and in the vicinity of the integrated circuit 501, the piezoelectric vibrator 1 is mounted thereon. These electronic part 502, integrated circuit 501 and piezoelectric vibrator 1 are electrically connected to each other with a wiring pattern (not shown). The constitutive parts each are molded with a resin (not shown).

In the thus-constituted oscillator 500, when a voltage is applied to the piezoelectric vibrator 1, then the piezoelectric vibration member 4 in the piezoelectric vibrator 1 is vibrated. The vibration is converted into an electric signal owing to the piezoelectric characteristic that the piezoelectric vibration member 4 has, and the electric signal is inputted into the integrated circuit 501. The thus-inputted electric signal is processed variously in the integrated circuit 501, and is outputted as a frequency signal. Accordingly, the piezoelectric vibrator 1 functions as an oscillation member.

In case where the integrated circuit 501 is, for example, so constituted that an RTC (real time clock) module or the like is defined therein selectively on demand, then the oscillator may act as a single-function oscillator for clocks or the like, or a function of controlling the operation date or time of the device or its external devices or providing a time, a calendar or the like may be added to the oscillator.

The oscillator 500 of this embodiment comprises the high-quality piezoelectric vibrator 1, in which the airtightness inside the cavity C is secured and of which the operation reliability has been improved, and therefore, the operation reliability of the oscillator 500 itself can also be enhanced and the quality thereof can be increased. In addition, the oscillator may give stable and precision frequency signals for a long period of time.

An example comprising the piezoelectric vibrator 1 of the first embodiment is described in the above; however, the piezoelectric vibrators of other embodiments can exhibit the same advantage and effect.

Figure 35:
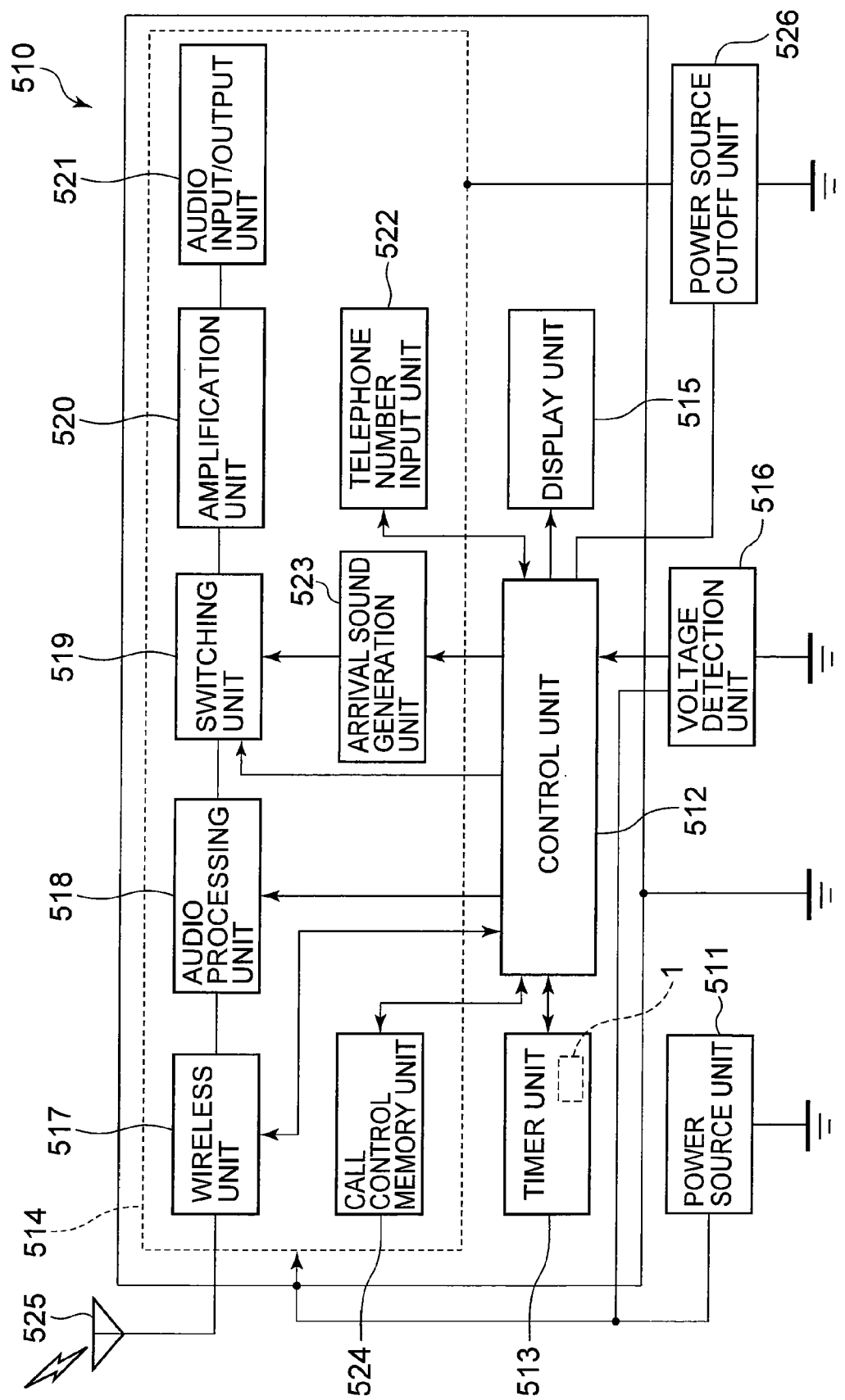
FIG. 35 is a constitutive view showing one embodiment of the electronic device of the invention.

Next described is one embodiment of the electronic device of the invention, with reference to FIG. 35. As the electronic device, a portable information device 510 having the piezoelectric vibrator 1 of the first embodiment is illustrated below.

First, the portable information device 510 of this embodiment is, for example, typically a portable telephone, which is developed and improved from a prior-art wristwatch. Its appearance is similar to a wristwatch, and a liquid-crystal display is disposed in the part corresponding to the dial plate, and the current time or the like can be displayed on the panel. In case where it is utilized as a communication device, then it is taken off from the wrist, and via the speaker or the microphone built in the inside part of the band, communication can be attained like in the case of prior-art portable telephones. However, as compared with conventional portable telephones, the device of the invention is remarkably down-sized and weight-saved.

Next described is the constitution of the portable information device 510 of this embodiment. The portable information device 510 is provided with the piezoelectric vibrator 1 and a power source part 511 for power supply, as shown in FIG. 35. The power source part 511 comprises, for example, a lithium secondary battery. To the power source part 511, connected are a control part 512 for various control, a timer part 513 for counting time and the like, a communication part 514 for external communication, a display part 515 for displaying various information, and an voltage detection part 516 for detecting the voltage of the individual functional parts, all in parallel to each other. Via the power source part 511, power is supplied to the respective functional parts.

The control part 512 controls the individual functional parts, transmits and receives voice data, and counts and displays the current time, therefore controlling the operation of the entire system. The control part 512 is provided with ROM where a program is previously written, CPU for reading out the program written in ROM and executing it, and RAM to be used as a work area of CPU, etc.

The timer part 513 is provided with an integrated circuit that comprises an oscillation circuit, a register circuit, a counter circuit, an interface circuit and the like all built therein, and the piezoelectric vibrator 1. When a voltage is applied to the piezoelectric vibrator 1, then the piezoelectric vibration member 4 is vibrated and the vibration is converted into an electric signal owing to the piezoelectric characteristic that the quartz crystal has, and the electric signal is inputted into the oscillation circuit. The output from the oscillation circuit is binarized and counted by the resistor circuit and the counter circuit. Then, two-way signal transmission to the control part 512 is attained via the interface circuit, and the current time, the current date, the calendar information and the like are displayed in the display part 515.

The communication part 514 has the same function as that of a conventional portable telephone, and is provided with a wireless part 517, a voice processing part 518, a switch part 519, an amplification part 520, a voice input/output part 521, a telephone number input part 522, a ring alert generation part 523, and a call control memory part 524.

The wireless part 517 undergoes two-way transmission of various data such as voice data and the like to the base station via an antenna 525. The voice processing part 518 codes and decodes the voice signal inputted from the wireless part 517 or the amplification part 520. The amplification part 520 amplifies the signal inputted from the voice processing part 518 or the voice input/output part 521 up to a predetermined level. The voice input/output part 521 comprises a speaker, a microphone or the like, and this amplifies the ring alert or the received voice, or collects the voice.

The ring alert generation part 523 generates a ring alert in accordance with the call from the base station. The switch part 519 turns the amplification part 520 connected to the sound processing part 518 to the ring alert generation part 523 only in calling whereby the ring alert generated in the ring alert generation part 523 is outputted to the voice input/output part 521 via the amplification part 520.

The call control memory part 524 houses a program relating to communication incoming/outgoing call control. The telephone number input part 522 is provided with number keys of, for example, from 0 to 9 and other keys, and by pushing these number keys and others, the calling telephone number or the like is inputted.

The voltage detection part 516 detects the voltage depression and notifies it to the control part 512, when the voltage applied to the various functional parts such as the control part 512 and others from the power source part 511 has fallen below the predetermined level. The predetermined voltage is a value previously set as the minimum voltage necessary for stable operation of the communication part 514, and is, for example, around 3 V. The control part 512 that has received the notice of voltage depression from the voltage detection part 516 inhibits the operation of the wireless part 517, the voice processing part 518, the switch part 519 and the ring alert generation part 523. In particular, the operation stopping of the wireless part 517 that consumes much power is indispensable. Further, the display part 515 displays the unavailability of the communication part 514 owing to the shortage of the battery residue.

Specifically, the voltage detection part 516 and the control part 512 inhibit the operation of the communication part 514, which may be displayed on the display part 515. The display may be a letter message, or for more intuitive expression, a mark (x) (unavailability mark) may be given to the telephone icon to be displayed in the upper part of the display panel of the display part 515.

A power shutdown part 526 capable of selectively shutting down the power relating to the function of the communication part 514 may be provided whereby the function of the communication part 514 may be more surely stopped.

The portable information device 510 of this embodiment comprises the high-quality piezoelectric vibrator 1, in which the airtightness inside the cavity C is secured and of which the operation reliability has been improved, and therefore, the operation reliability of the portable information device itself can also be enhanced and the quality thereof can be increased. In addition, the device can exhibit stable and precision time information for a long period of time.

An example comprising the piezoelectric vibrator 1 of the first embodiment is described in the above; however, the piezoelectric vibrators of other embodiments can exhibit the same advantage and effect.

Figure 36:
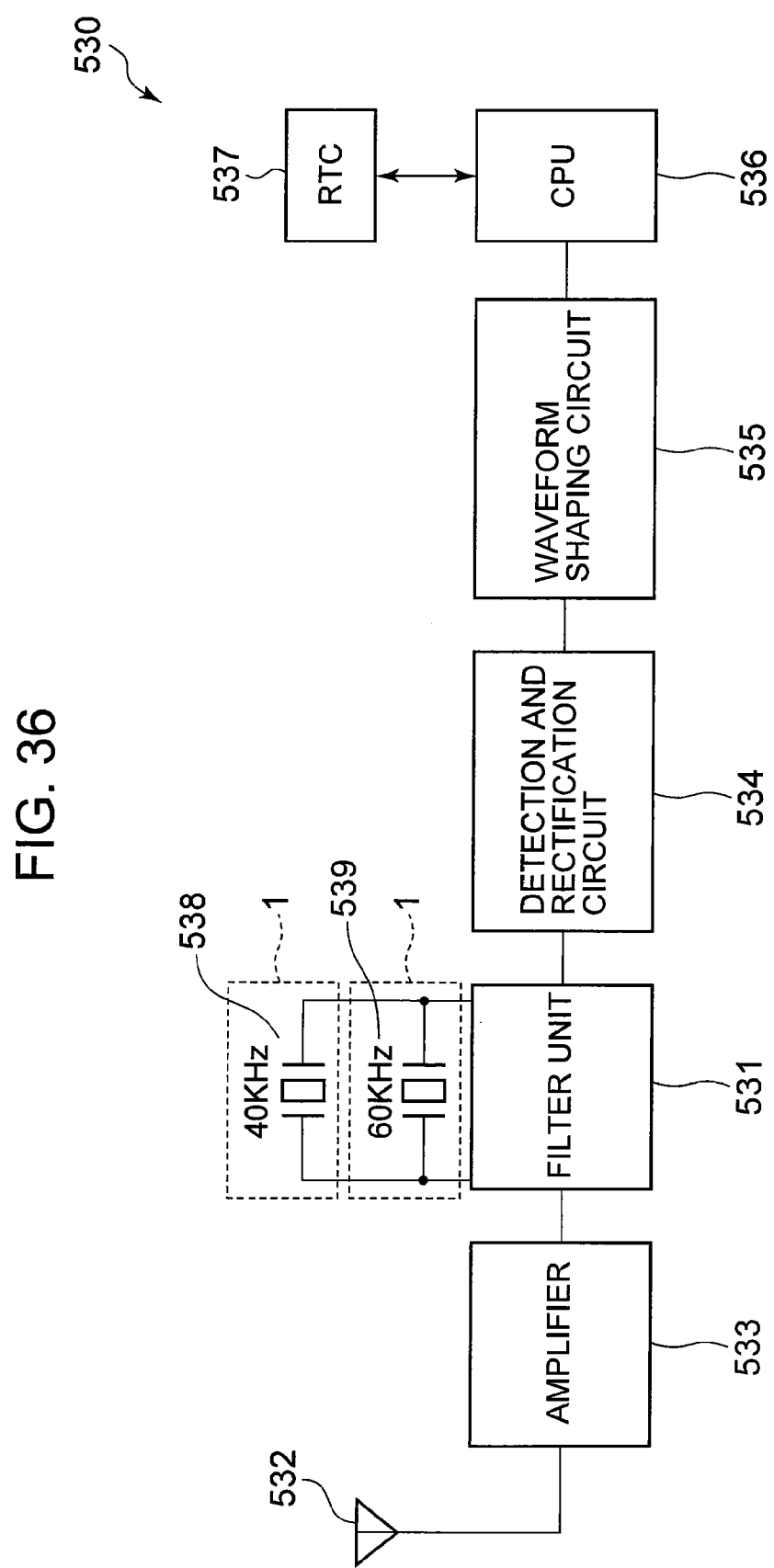
FIG. 36 is a constitutive view showing one embodiment of the radio-controlled watch of the invention.

Next described is one embodiment of the radio-controlled watch of the invention, with reference to FIG. 36. In this embodiment, an oscillator provided with the piezoelectric vibrator 1 of the first embodiment is illustrated as an example.

The radio-controlled watch 530 of this embodiment comprises the piezoelectric vibrator 1 electrically connected to a filter part 531, as shown in FIG. 36, and this is a watch having the function of receiving standard waves that include time information, automatically correcting it to a correct time and displaying the time.

In Japan, there are transmitter stations for transmitting standard waves in Fukushima prefecture (40 kHz) and Saga prefecture (60 kHz), and they transmit standard waves. The long wave of 40 kHz or 60 kHz has both the property or passing on the land surface and the property of reflecting on the ionosphere and the land surface and passing thereon; and therefore, its passing region is broad, and the above-mentioned two transmitter stations cover everywhere in Japan.

The details of the functional constitution of the radio-controlled watch 530 are described below.

The antenna 532 receives a long standard wave of 40 kHz or 60 kHz. For the long standard wave, a carrier wave of 40 kHz or 60 kHz is processed for AM modulation with a time information referred to as a time code. The received long standard wave is amplified by the amplifier 533, and filtered and synchronized by the filter part 531 paving a plurality of piezoelectric vibrators 1.

The piezoelectric vibrators 1 in this embodiment each are provided with a quartz crystal vibration member 538 or 539 having the same resonance frequency of 40 kHz or 60 kHz as the above-mentioned carrier frequency.

Further, the filtered signal having a predetermined frequency is detected and demodulated by the detection/rectification circuit 534. Subsequently, via the waveform shaper circuit 535, the time code is taken out, and counted in CPU 536. In CPU 536, information such as the current year, the accumulated date, the week day, the time and the like are read out. The read-out information is reflected by RTC 537, and the accurate time information is thereby displayed.

The carrier wave is 40 kHz or 60 kHz, and therefore, the quartz crystal vibration members 538 and 539 are preferably the above-mentioned, tuning fork-like vibrators.

The above explanation is for an example in Japan; however, the frequency of the long standard wave differs in foreign countries. For example, in Germany, a standard wave of 77.5 kHz is employed. Accordingly, in case where a radio-controlled watch 530 applicable to foreign use is built in a portable device, it further requires the piezoelectric vibrator 1 of which the frequency differs from that in Japan.

The radio-controlled watch 530 of this embodiment comprises the high-quality piezoelectric vibrator 1, in which the airtightness inside the cavity C is secured and of which the operation reliability has been improved, and therefore, the operation reliability of the radio-controlled watch itself can also be enhanced and the quality thereof can be increased. In addition, the watch can count time stably with accuracy for a long period of time.

An example comprising the piezoelectric vibrator 1 of the first embodiment is described in the above; however, the piezoelectric vibrators of other embodiments can exhibit the same advantage and effect.

The technical scope of the invention is not limited to the above-mentioned embodiments, and various changes may be given thereto not overstepping the scope and the sprit of the invention.

For example, in the above-mentioned embodiments, an example of a grooved piezoelectric vibration member having a groove formed in both faces of the vibration arms is illustrated as one example of the piezoelectric vibration member; however, a piezoelectric vibration member with no groove may also be employed herein. However, forming the groove may increase the field effect efficiency between a pair of excitation electrodes when a predetermined voltage is applied to the pair of excitation electrodes, and therefore the vibration loss may be reduced and the vibration characteristics may be further enhanced. In other words, the CI value (crystal impedance) may be further reduced, and the performance of the piezoelectric vibration member can be further enhanced. In this respect, forming the groove is preferred.

In the above-mentioned embodiments, an example of a tuning folk-type piezoelectric vibration member is illustrated; however, the vibration member is not limited to the tuning folk-type one. For example, it may be a thickness-shear vibration member.

In the above-mentioned embodiments, the base substrate and the lid substrate are anodically bonded via a bonding film; but the bonding mode is not limited to anodic bonding. However, anodic bonding is preferred as capable of firmly bonding the two substrates.

In the above-mentioned embodiments, the piezoelectric vibration member is bump-bonded, but the bonding mode is not limited to bump-bonding. For example, the piezoelectric vibration member may be bonded with an electroconductive adhesive. However, bump-bonding makes it possible to space the piezoelectric vibration member from the upper face of the base substrate, and naturally ensures the minimum vibration gap necessary for vibration. Accordingly, bump-bonding is preferred.

In the above-mentioned embodiments, the through-hole is formed to have a tapered cross section, but may be formed to have a straight form. However, in forming the tapered form, an ordinary method such as a sand-blasting method or the like is usable, and therefore, the through-hole forming step is easy. Accordingly, this is more preferred as capable of contributing toward further improving the manufacture efficiency. In case where the through-hole is formed to have a tapered form, the paste or the connection member such as glass frit or the like hardly drops off, and the tapered form is more preferred in this point.

In the above-mentioned embodiments, a pair of through-electrodes are provided; however, one or three or more may be provided.

In the setting step in the first embodiment, the paste may be implanted in the through-hole after defoamed (for example, by centrifugal defoaming or vacuuming). Through the pre-defoaming treatment, a paste containing few bubbles may be implanted. Accordingly, the paste volume reduction may be further inhibited.

Figure 37:
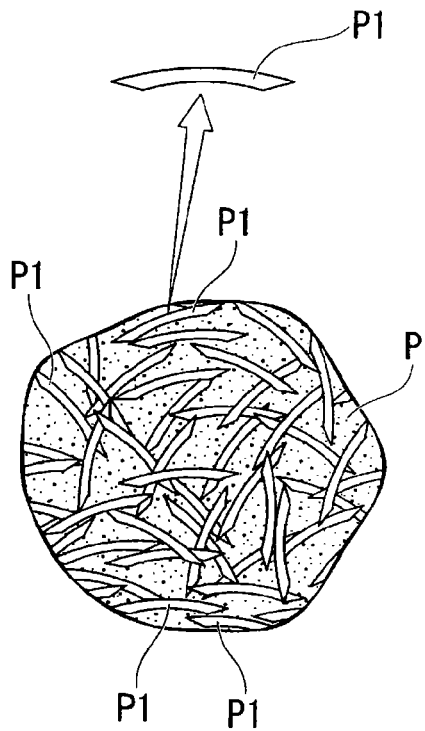
FIG. 37 is a view showing a modification of the first embodiment, in which the paste contains a plurality of metal fine particles.

In this case, as shown in FIG. 37, a paste P containing a plurality of metal fine particles P1 may be used. In FIG. 37, the metal fine particles P1 are thin and fibrous ones (non-spherical ones) formed of copper or the like. Use of the paste P containing such metal fine particles P1 secures the electric conductivity owing to the contact of those plural metal fine particles P1 with each other in addition to the core member. Accordingly, the electroconductivity performance of the through-electrodes can be further enhanced, and the quality of the device can be further increased.

The shape of the metal fine particles P1 may be any other one. For example, it may be spherical. Also in this case, when the metal fine particles P1 are brought into contact with each other, they may be in a point contact state and can therefore also secure the electric conductivity. However, in case where thin and long fibrous, non-spherical metal fine particles P1 are used, then they may be readily in a linear contact state but not in a point contact stage when they are brought into contact with each other. Accordingly, the paste P preferably contains non-spherical metal fine particles P1 rather than spherical ones.

Figure 38A:
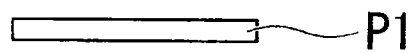
FIG. 38A is a view showing a modification of the metal fine particle shown in FIG. 37, and is a view showing a metal fine particle formed to be a strip-like one.
Figure 38B:
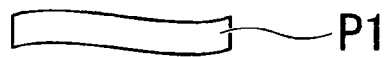
FIG. 38B is a view showing a modification of the metal fine particle shown in FIG. 37, and is a view showing a metal fine particle formed to be a waved one.
Figure 38C:
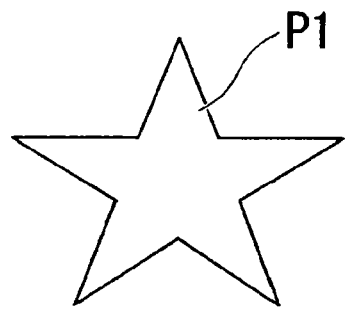
FIG. 38C is a view showing a modification of the metal fine particle shown in FIG. 37, and is a view showing a metal fine particle formed to have a star-shaped cross section.
Figure 38D:
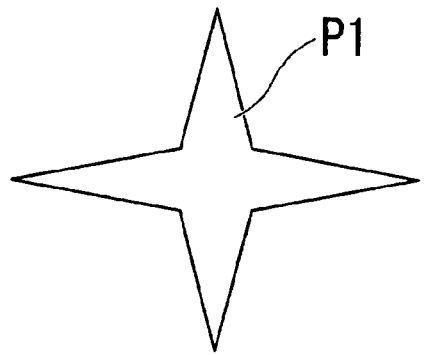
FIG. 38D is a view showing a modification of the metal fine particle shown in FIG. 37, and is a view showing a metal fine particle formed to have a crisscross section.

In case where the metal fine particles P1 are non-spherical, for example, they may be strip-like ones as shown in FIG. 38A, or may be waved ones as shown in FIG. 38B, or may be those having a star-shaped cross section as shown in FIG. 38C, or may be those having a crisscross section as shown in FIG. 38D.

Figure 39:
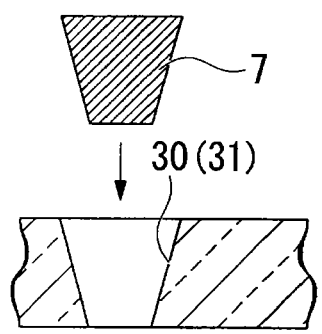
FIG. 39 is a view showing a modification of the piezoelectric vibrator of the invention, and is a view of a case where a tapered core member is used to form the through-electrode.

In the first embodiment, the core member is columnar, however, this shape is not limitative. It may be prismatic, for example, a quadratic prism; or may have a tapered cross section. In particular, as shown in FIG. 39, in case where the core member 7 is tapered, it may be readily inserted into the through-hole 30 (31) as its top is thinned. Accordingly, use of the tapered core member 7 is preferred. In this respect, the same shall apply also to the second embodiment.

In the first embodiment, a core member of which the thermal expansion coefficient is substantially equal to that of the base substrate (base substrate wafer) is preferably used.

In this case, the base substrate and the core member thermally expand similarly in firing. Accordingly, any excessive pressure is not given to the base substrate wafer to crack it, owing to the difference in the thermal expansion coefficient, or the space between the core member and the through-hole is not broadened more. Therefore, the quality of the piezoelectric vibrator can be increased.

In case where the base substrate (base substrate wafer) is formed of a glass material, then Kovar, Fe—Ni, Dumet wire or the like, of which the thermal expansion coefficient is substantially equal to that of the glass material, is preferably used as the core member material.

In the second embodiment, the glass frit is formed to have a conical (tapered) outer shape; however, the shape is not limitative. For example, it may be formed to have a cylindrical shape having a uniform outer diameter. Also in this case, the same advantage and effect can be exhibited. In this case, however, the shape of the through-hole must be straight but not tapered. In other words, the glass frit may be formed to have a cylindrical shape into which a core member can be inserted, and its outer shape can be suitably changed or modified in accordance with the shape of the through-hole.

The center hole of the glass frit may be shaped not to have a straight cross section but have an angular cross section, or may also be shaped to have a tapered cross section. In this case, the shape of the core member is formed to be not columnar but angular or tapered. Also in this case, the same advantage and effect can be exhibited.

In the second embodiment, the core member is preferably one, of which the thermal expansion coefficient is substantially equal to that of the base substrate (base substrate wafer) and that of the glass frit.

In this case, the three of the base substrate wafer, the glass frit and the core member can thermally expand to the same degree in firing. Accordingly, any excessive pressure is not given to the base substrate wafer and the glass frit to crack them, owing to the difference in the thermal expansion coefficient, or the space between the glass frit and the through-hole or between the glass frit and the core member is not formed. Therefore, through-electrodes having higher quality can be formed; and as a result, piezoelectric vibrators having further higher quality can be manufactured.

In case where the base substrate (base substrate wafer) is formed of the same glass material as that for the glass fit, then Kovar, Fe—Ni, Dumet wire or the like, of which the thermal expansion coefficient is substantially equal to that of the glass material, is preferably used as the core member material.

Figure 40:
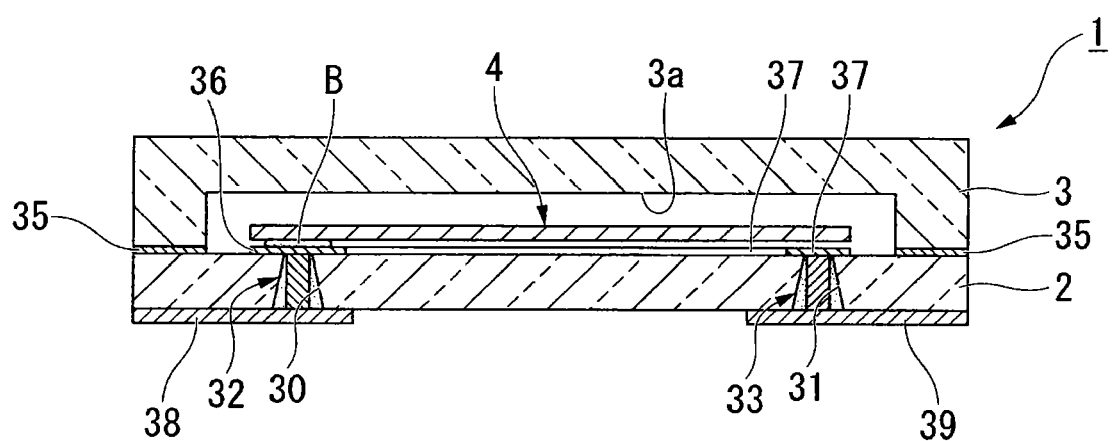
FIG. 40 is a cross-sectional view showing a modification of the piezoelectric vibrator of the invention.
Figure 41:
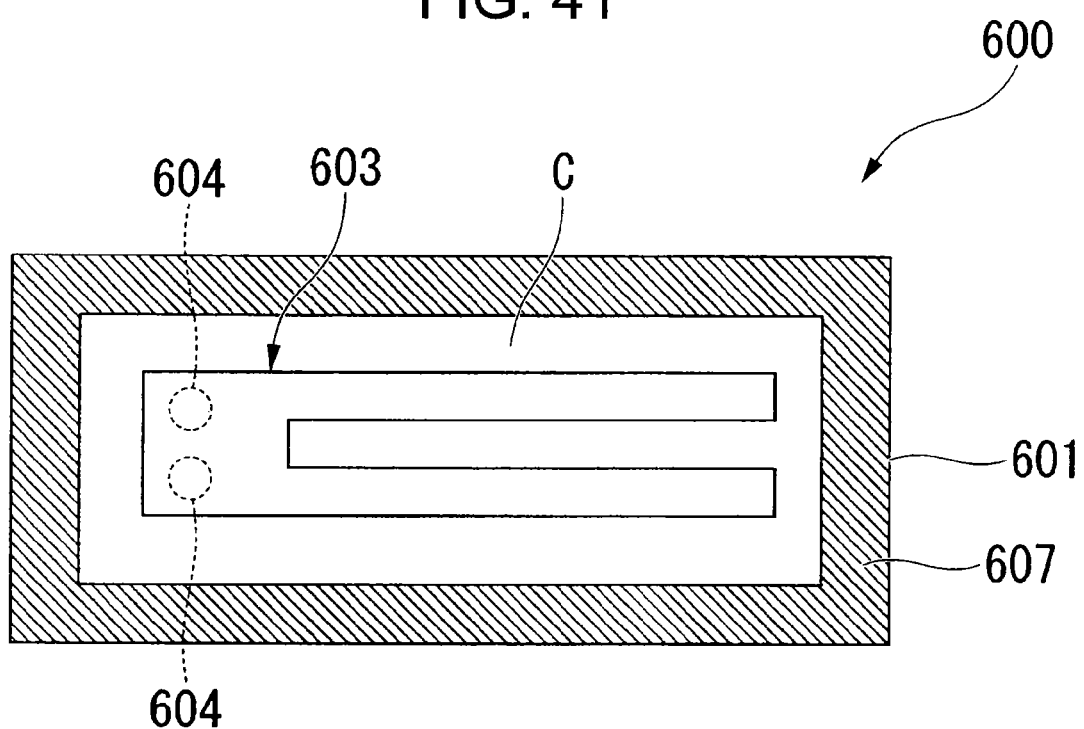
FIG. 41 is an internal configuration view of a conventional piezoelectric vibrator, and is a top view of the piezoelectric vibration member thereof from which the lid substrate was removed.
Figure 42:
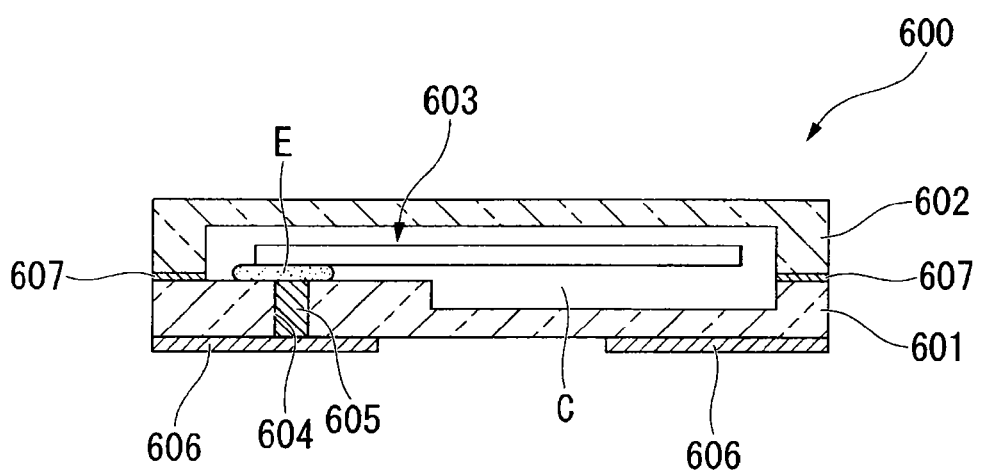
FIG. 42 is a cross-sectional view of the piezoelectric vibrator shown in FIG. 41.

In the above-mentioned embodiments, the through-holes are so designed that their diameter gradually increases toward the external electrodes; but on the contrary, the through-electrodes 32 and 33, of which the diameter gradually decreases toward the external electrodes 38 and 39, may be provided, as shown in FIG. 40. Also in this case, the same advantage and effect can be exhibited.

The invention claimed is:

1. A method for manufacturing a plurality of piezoelectric vibrators in which a piezoelectric vibration member is sealed up in a cavity formed between a base substrate and a lid substrate bonded to each other, all at once by utilizing a base substrate wafer and a lid substrate wafer, the method comprising:
    a recess forming step of forming, in the lid substrate wafer, a plurality of cavity recesses for forming cavities when the two wafers are overlaid;
    a through-electrode forming step of forming a plurality of through-electrodes in and through the base substrate wafer;
    a routing electrode forming step of forming a plurality of routing electrodes connected electrically with the through-electrodes, on the upper face of the base substrate wafer;
    a mounting step of bonding the plural piezoelectric vibration members to the upper face of the base substrate wafer via the routing electrodes;
    an overlaying step of overlaying the base substrate wafer and the lid substrate wafer thereby to house the piezoelectric vibration members in the cavities surrounded by the recesses and the two wafers;
    a bonding step of bonding the base substrate wafer and the lid substrate wafer thereby to seal up the piezoelectric vibration members in the cavities;
    an external electrode forming step of forming a plurality of external electrodes connected electrically with the through-electrodes, on the lower face of the base substrate wafer; and
    a cutting step of cutting the two bonded wafers thereby to shred them into the plural piezoelectric vibrators;
    wherein the through-electrode forming step includes a through-hole forming step of forming a plurality of through-holes in and through the base substrate wafer; a setting step of disposing electroconductive core members which are formed to have two flat ends and a thickness substantially equal to that of the base substrate wafer, in the plurality of through-holes, and disposing connection members between the core members and the through-holes; and a firing step of firing the connection members at a predetermined temperature to thereby integrally fix the through-hole, the connection member and the core member to each other.

2. The method for manufacturing piezoelectric vibrators as claimed in claim 1;
    wherein a paste is used as the connection member;
    in the setting step, the paste is implanted between the core member and the through-hole; and
    in the firing step, the implanted paste is fired and hardened to thereby integrally fix the paste, the core member and the through-hole to each other.

3. The method for manufacturing piezoelectric vibrators as claimed in claim 2;
    wherein as the core member, one of which the thermal expansion coefficient is substantially equal to that of the base substrate wafer is used.

4. The method for manufacturing piezoelectric vibrators as claimed in claim 2;
    wherein in the setting step, a paste containing a plurality of metal fine particles is implanted.

5. The method for manufacturing piezoelectric vibrators as claimed in claim 4;
    wherein as the metal fine particles, non-spherically formed ones are used.

6. The method for manufacturing piezoelectric vibrators as claimed in claim 2;
    wherein in the setting step, the paste is implanted in the through-holes after processed for defoaming.

7. The method for manufacturing piezoelectric vibrators as claimed in claim 1;
    wherein as the connection member, a cylindrical body of a glass material which is formed to have two flat ends and a thickness substantially equal to that of the base substrate wafer, is utilized;
    in the setting step, the cylindrical body is implanted in the through-hole and the core member is inserted into the center hole of the cylindrical body;
    in the firing step, the implanted cylindrical body is fired to thereby integrally fix the cylindrical body, the through-hole and the core member to each other.

8. The method for manufacturing piezoelectric vibrators as claimed in claim 7;
    wherein as the cylindrical body, one previously temporary-fired before firing is used.

9. The method for manufacturing piezoelectric vibrators as claimed in claim 7;
    wherein as the base substrate wafer, one formed of the same glass material as that of the cylindrical body is used;
    as the core member, one of which the thermal expansion coefficient is substantially equal to that of the cylindrical body is used.

10. The method for manufacturing piezoelectric vibrators as claimed in claim 1;
    wherein prior to the mounting step, the method comprises a bonding film forming step of forming, on the upper face of the base substrate wafer, a bonding film to surround the periphery of the recesses when the base substrate wafer and the lid substrate wafer are overlaid;

in the bonding step, the two wafers are anodically bonded via the bonding film.

11. The method for manufacturing piezoelectric vibrators as claimed in claim 1;

wherein in the mounting step, the piezoelectric vibration members are bump-bonded with an electroconductive bump.

12. The method for manufacturing piezoelectric vibrators as claimed in claim 1;

wherein in the through-hole forming step, the through-holes are formed to have a tapered cross section.

13. The method for manufacturing piezoelectric vibrators as claimed in claim 1;

wherein in the through-electrode forming step, a core member having a tapered cross section is used as the core member.

* * * * *